(12) United States Patent
Jones et al.

(10) Patent No.: US 8,552,779 B2
(45) Date of Patent: Oct. 8, 2013

(54) SYNCHRONIZER LATCH CIRCUIT THAT FACILITATES RESOLVING METASTABILITY

(75) Inventors: Ian W. Jones, Palo Alto, CA (US);
Suwen Yang, Mountain View, CA (US);
Mark R. Greenstreet, Vancouver (CA);
Hetal N. Gaywala, Mountain View, CA (US); Robert J. Drost, Los Altos, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 13/306,828

(22) Filed: Nov. 29, 2011

(65) Prior Publication Data

US 2013/0135017 A1    May 30, 2013

(51) Int. Cl.
*H03K 3/356*    (2006.01)
(52) U.S. Cl.
USPC .......................................... 327/212; 327/218
(58) Field of Classification Search
USPC ........................... 327/141, 208, 212, 215, 218
See application file for complete search history.

(56) References Cited

U.S. PATENT DOCUMENTS

| | | | | |
|---|---|---|---|---|
| 5,138,189 | A | * | 8/1992 | Leung et al. ................ 327/198 |
| 5,510,732 | A | * | 4/1996 | Sandhu ......................... 326/94 |
| 6,072,346 | A | * | 6/2000 | Ghahremani ................ 327/198 |
| 7,977,983 | B1 | * | 7/2011 | Priel et al. ..................... 327/145 |

* cited by examiner

*Primary Examiner* — Lincoln Donovan
*Assistant Examiner* — William Hernandez
(74) *Attorney, Agent, or Firm* — Park, Vaughan, Fleming & Dowler, LLP; Mark Spiller

(57) ABSTRACT

The disclosed embodiments provide a synchronizer latch circuit that facilitates resolving metastability issues. This synchronizer latch circuit includes a set of lightly loaded, cross-coupled transistors that form a metastable resolving and state-holding element that is coupled to two outputs. An incoming synchronization signal creates a voltage difference between the two outputs, but does not directly force a state change for the outputs. Instead, the data and clock inputs control transistors that allow neighboring power sources and/or ground network connections to weakly influence the outputs. The cross-coupled transistors then amplify the resulting voltage difference to generate valid output voltages, even when the data input and clock signal are received at roughly the same time. Thus, the synchronizer latch circuit facilitates rapidly resolving metastability and improving synchronizer performance.

20 Claims, 18 Drawing Sheets

SYNCHRONIZER LATCH CIRCUIT THAT FACILITATES RESOLVING METASTABILITY

BACKGROUND

1. Field of the Invention

This disclosure generally relates to circuits and techniques for synchronizing signals from different clock domains. More specifically, this disclosure relates to circuits and techniques that resolve metastability issues while synchronizing signals.

2. Related Art

Clock signals are often distributed globally over an entire integrated circuit. However, as clock frequencies and the number of transistors on an integrated circuit continue to increase, implementing such global clock signals becomes increasingly difficult. Moreover, integrated circuits commonly contain different functional blocks that operate at different speeds. Consequently, many integrated circuits include multiple timing domains. In such integrated circuits, large numbers of synchronizing circuits ("synchronizers") are often used to interface the different timing domains.

Unfortunately, synchronizer performance does not scale at the same rate as logic-gate performance for deep sub-micron technologies. Furthermore, design criteria for data flip-flops can favor choosing circuit topologies and device sizes that negatively affect synchronizer robustness. For instance, synchronizers that are based on standard data-path flip-flops that strive to minimize data-path delay have become a poor choice for synchronizer use.

Hence, what is needed are synchronization techniques and circuits that facilitate synchronizing across different clock domains without the above-described problems.

SUMMARY

The disclosed embodiments provide a synchronizer latch circuit that facilitates resolving metastability issues. This synchronizer latch circuit includes a set of lightly loaded, cross-coupled transistors that form a metastable resolving and state-holding element that is coupled to two outputs. An incoming synchronization signal creates a voltage difference between the two outputs, but does not directly force a state change for the outputs. Instead, the data and clock inputs control transistors that allow neighboring power sources and/or ground network connections to weakly influence the outputs. The cross-coupled transistors then amplify the resulting voltage difference to generate valid logic output voltages, even when the data input and clock signal are received at roughly the same time. Thus, the synchronizer latch circuit facilitates rapidly resolving metastability and improving synchronizer performance.

In some embodiments, the synchronizer comprises two or more cross-coupled transistors. The gate of the first cross-coupled transistor is coupled to the second output, the gate of the second cross-coupled transistor is coupled to the first output, the drain of the first cross-coupled transistor is coupled to the first output, and the drain of the second cross-coupled transistor is coupled to the second output. The data input is coupled to the gate of a third transistor. During operation, upon receiving a synchronization signal, the data input activates the third transistor to change the voltage of the first output and create a voltage difference between the first output and the second output. As mentioned above, the cross-coupled transistors amplify this voltage difference to generate valid logic output voltages, thereby resolving metastability issues even when the data input arrives within the setup-and-hold time window of the synchronizer latch circuit.

In some embodiments, the data signal drives transistors that enable at least one of a power source and a virtual ground to weakly influence one or both of the outputs, thereby facilitating resolving output voltages for the outputs more quickly.

In some embodiments, the drain of the third transistor is coupled to the drain of the first transistor, the source of the third transistor is coupled to the drain of a fourth transistor, and the source of the fourth transistor is coupled to a power source. In these embodiments, the gate of the fourth transistor is controlled by a clock signal from the clock input. Moreover, when (1) the clock signal sets the synchronizer latch circuit into a transparent state, and (2) the data input activates the third transistor, the power source weakly drives the first output to a high voltage via the fourth transistor and the third transistor.

In some embodiments, the complement of the data input is coupled to the gate of a fifth transistor, the source of the fifth transistor is coupled to ground, and the drain is coupled to the source of the second transistor. In these embodiments, when the data input enables the first output to be driven by the power source, the data input's complement enables the second output to be strongly pulled down to a low voltage via the fifth transistor and the second transistor.

In some embodiments, the gate of a sixth transistor is coupled to the second output, the drain is coupled to the first output, and the source is coupled to the power source. The gate of the sixth transistor is enabled when the second output is driven low, thereby enabling the power source to strongly drive the first output to a high voltage. Feedback across the cross-coupled transistors then amplifies and stabilizes the voltages of the two outputs, thereby resolving them to valid logic high and low voltages.

In some embodiments, when the clock signal sets the synchronizer latch circuit into an opaque state, the clock signal disables current flow through the fourth transistor and enables a set of additional transistors that connect the sources of the first and second transistors to ground-forming virtual-ground nodes (also referred to as a "virtual ground") at the sources of the first and second transistors. This virtual ground connection and the signals held by the cross-coupled transistors then hold the output values at stable logic levels when the synchronizer latch circuit is in the state-holding opaque state.

In some embodiments, two or more synchronizer latch circuits are combined in series to improve the mean time between failures for the synchronization signal.

In some embodiments, a conventional data-path flip-flop serves as a final synchronization stage for a chain of two or more synchronizer stages. The low clock-to-Q delay of the conventional data-path flip-flop facilitates adding more combinational logic after the final synchronization stage.

In some embodiments, the synchronization latch circuit includes a multiplexer that selects between the data input and a scan-in signal and a scan-out latch coupled to one of the outputs. These additional features facilitate circuit reset, circuit initialization, and chip testing.

In an alternative embodiment: the gates of a seventh and an eighth transistor are coupled to a reference voltage; the sources of the seventh and eighth transistors are coupled to a power source; the drain of the first transistor is coupled to the drain of the seventh transistor; the drain of the second transistor is coupled to the drain of the eighth transistor; the source of the third transistor is coupled to ground; and the drain of the third transistor is coupled to the source of the first transistor. In these embodiments, the seventh and eighth transistors passively pull up the voltage levels for the two outputs, thereby activating the first transistor and the second transistor. When the data input enables the third transistor, the voltage at the first output is pulled lower than the voltage at the second output, and feedback between the cross-coupled transistors drives the second output to a high voltage and drives the first output to a low voltage.

In some embodiments, the reference voltage is ground.

In some embodiments, when a clock signal sets the synchronizer latch circuit into an opaque state, the clock signal enables a set of transistors that turn the nets that the source nodes of the first and second transistors are connected to into virtual ground nets. Under these conditions, when the latch is in its state-holding opaque state, the cross-coupled transistors amplify the difference in voltage between their drain nodes such that they drive and then hold the first and second outputs to opposite logic HI and LOW voltages.

DETAILED DESCRIPTION

Figure 1:
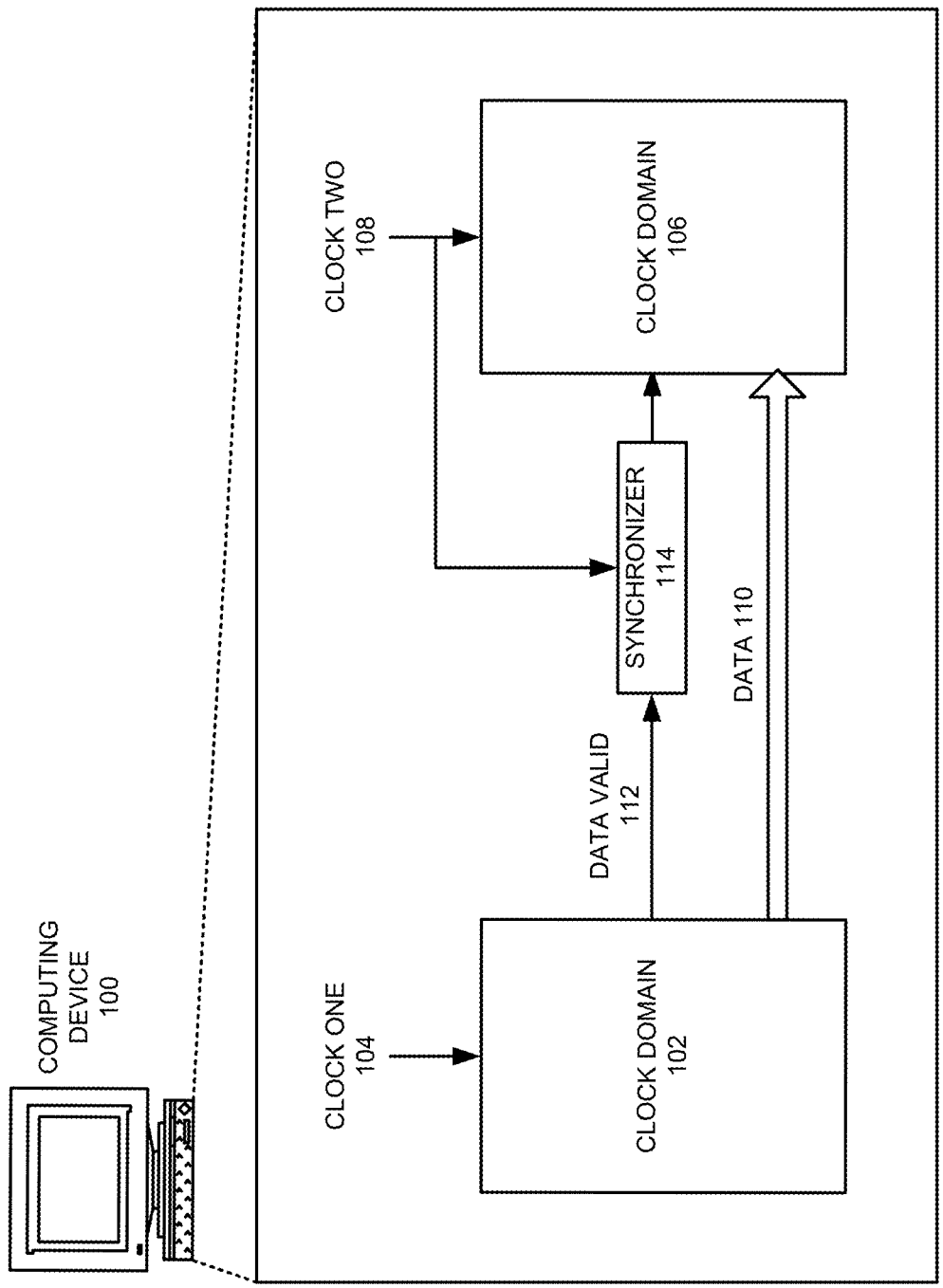
FIG. 1 illustrates a computing device that includes multiple, independent clock domains that communicate with each other in accordance with an embodiment.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a non-transitory computer-readable storage medium, which may be any device or non-transitory medium that can store code and/or data for use by a computer system. The non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium.

Furthermore, the methods and processes described below can be included in hardware modules. For example, the hardware modules can include, but are not limited to, application-specific integrated circuit (ASIC) chips, a full-custom implementation as part of an integrated circuit (or another type of hardware implementation on an integrated circuit), field-programmable gate arrays (FPGAs), a dedicated or shared processor that executes a particular software module or a piece of code at a particular time, and/or other programmable-logic devices now known or later developed. When the hardware modules are activated, the hardware modules perform the methods and processes included within the hardware modules.

Synchronizing Signals Between Clock Domains

Increased integration densities enable designs that have multiple, independent clock domains on a single chip. Such designs often employ large numbers of synchronizers to achieve reliable communication between their multiple timing domains. The role of these synchronizers is to facilitate the reliable transfer of date from one clock domain to another. However, when these two clock domain have unrelated frequencies the data received may be changing just as it is being sampled, which can lead to problems (known as "failures") in the receive circuits. The reliability of these data transfers is often characterized by the mean time between failures, MTBF. The task of the synchronizer circuit is to greatly reduce the chances of such a failure occurring, (i.e., to increase the MTBF). Synchronizers do not eliminate all such failures, but if carefully designed can increase the MTBF such that the failure likelihood becomes insignificant. However, there is a tradeoff between achieving high reliability and high performance; synchronizer circuits comprising chains of cascaded latches improve reliability, but add latency that reduces performance.

However, synchronizer performance does not scale at the same rate as logic-gate performance for deep sub-micron process technologies at lower supply voltages. Furthermore, design criteria for data flip-flops can favor choosing circuit topologies and device sizes that negatively affect synchronizer robustness. The design objectives of latch circuits for data-path and synchronizer use are quite different. In latch circuits for data-path use, the latch storage element can be quite small, and can have low internal amplification because, by specification, it will always receive valid logic HI or LOW input signals. The primary design criterion of a data-path latch is achieving a very low clock-to-Q output delay. In contrast, a latch for a synchronizer needs to be able to handle input signals that are not valid logic levels, and the latch needs to use the internal amplification of its storage element to resolve any non-valid logic input voltages into valid logic voltage levels at its output as quickly as possible. Thus, the synchronizer latch requires larger, high-gain internal amplification storage circuits. Clock-to-Q output delay is a less critical parameter for a synchronizer latch, and longer clock-to-Q output delay can be tolerated when the latch enables faster output resolution. Faster resolution time is accomplished by using high-gain, cross-coupled transistors in the latch storage element, and by minimizing the capacitive load on these cross-coupled nodes.

The operation of a latch is different when its data input changes outside or inside the setup-and-hold input time window. When the input data signal changes inside the setup-and-hold time window (i.e., the input data value is changing just as the latch samples this input data value), then the latch can take longer to reach a decision as to whether the data was observed to be a logic HI or LOW voltage. This delayed decision results in an increased clock-to-Q output delay, which reduces the amount of time available for subsequent logic operations that depend upon the punctual arrival of the latch output. This in turn can result in the delayed delivery of logic signals to another latch that captures the output of these subsequent logic operations, thus potentially resulting in the sampling of an incomplete logic computation. When the input data changes just as it is sampled by the clock, the internal cross-coupled nodes in the synchronizer latch can stay close to the balance point between resolving the output voltages to HI/LOW or LOW/HI logic values for a prolonged time. This state of the latch is known as its "metastable" state, and the voltages of the cross-coupled nodes are said to be at their metastable voltages, that usually lie between the logic LOW and logic HI values. In general, synchronizers that are based on standard data-path flip-flops that strive to minimize data-path delay may sometimes have difficulties resolving their output nodes to stable logic HI and LOW voltages in one clock cycle when the input signal changes violate their setup-and-hold time windows.

One specific example of inter-clock-domain communication occurs between a high-frequency processor core and an external memory that has a lower, uncorrelated clock frequency. Data being transferred in both directions needs to be synchronized to each respective destination clock domain. Unfortunately, because the two clock domains are uncorrelated, an input data signal may sometimes change just as the destination clock initiates the sampling of the data value (e.g., in situations where the data is changing within the setup-and-hold time window, which would be a timing violation in normal data path use); because the data inputs arrive from a different, uncorrelated clock domain, such situations often cannot be avoided. Sampling changing data in a flip-flop can cause the latches to take longer to resolve to stable logic voltages, and can lead to additional output clock-to-output delay. Occasionally such situations can also lead to the generation of output voltage levels that lie somewhere between the logic 0 and logic 1 values (e.g., metastable voltages).

Metastability can typically be reliably resolved, given sufficient time. For instance, increasing the destination clock period gives a synchronizer more time to resolve an ambiguous output. However, increasing clock periods usually also negatively affects the compute performance of the device. Another alternative for resolving metastability does not increase the clock period, but instead uses a multi-stage pipelined synchronizer. Each additional synchronizer stage delays the receipt of the synchronization signal by an additional (destination) clock cycle, but also decreases the likelihood of a metastable output. A range of synchronizing circuits and stages may be needed, depending for instance on the frequency of the target clock domain and the process technology (and process size) being used to fabricate a chip. In many designs the transferring domain sets up the data being transferred (e.g., in a buffer or queue), and then uses a synchronized data valid signal to indicate to the receiving domain that the data is ready to be accessed.

FIG. 1 illustrates a computing device 100 that includes multiple, independent clock domains that communicate with each other. Clock domain 102 operates at a clock speed dictated by clock one 104, while clock domain 106 operates at a different clock speed dictated by clock two 108. Clock domain 102 sends data 110 to clock domain 106 by first properly setting up a set of data transfer structures (not shown) and then asserting a data valid signal 112. This data valid signal 112 is received by synchronizer 114, which ensures, with a very low probability of failure, that a clearly defined logic HI or LOW voltage signal is received by clock domain 106. More specifically, because clock domain 102 and clock domain 106 operate at different clock frequencies, there is no guarantee that the data valid signal 112 will adhere to a setup-and-hold time window for a receiving circuit in clock domain 106. Synchronizer 114 ensures, with a very low probability of failure, that a clearly defined logic HI or LOW voltage signal is received by clock domain 106 regardless of the arrival time of data valid signal 112.

Figure 2:
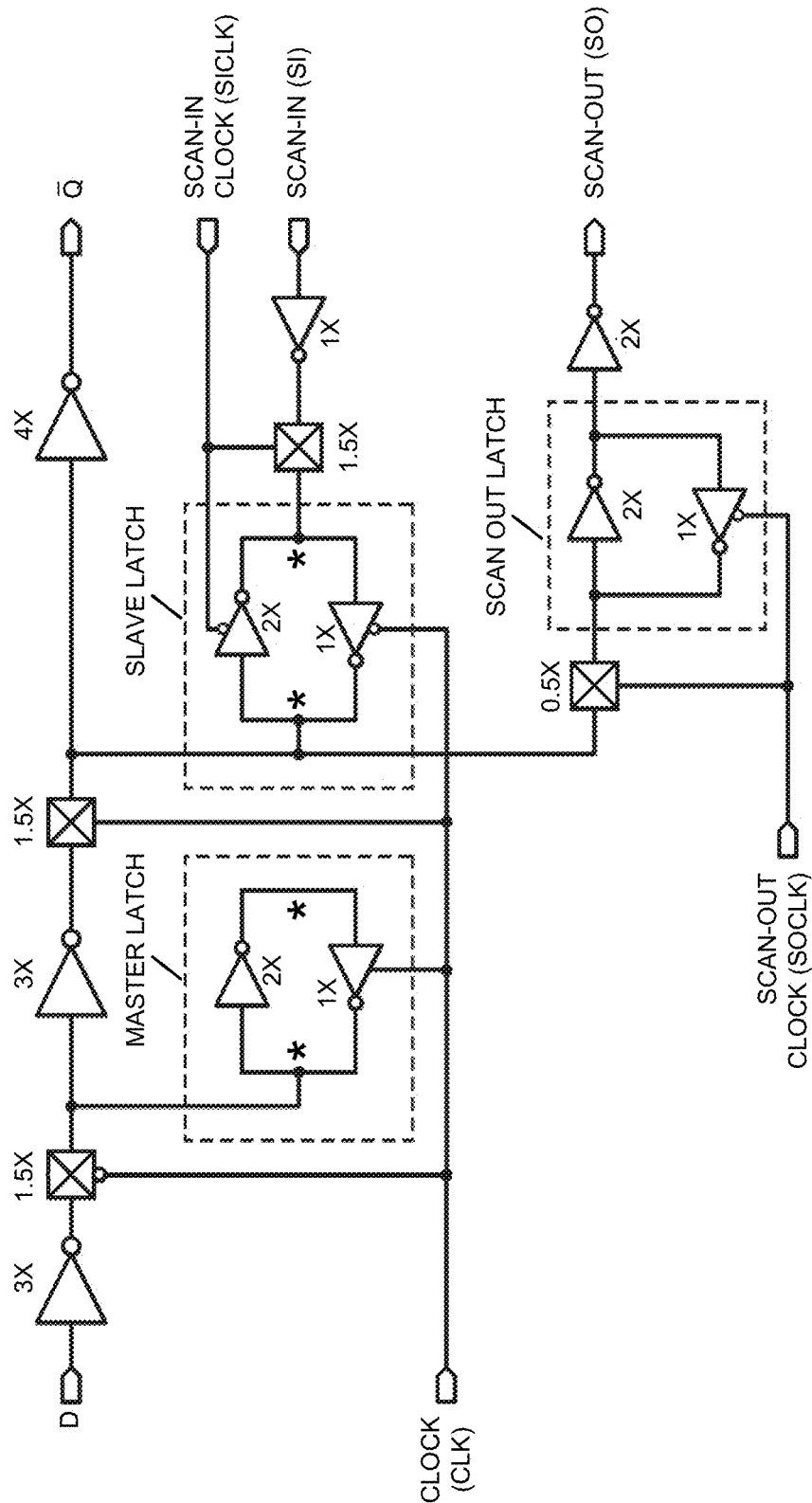
FIG. 2 illustrates a pass-gate synchronizer circuit that uses two cascaded latch cells in accordance with an embodiment.

In some embodiments, a "pass-gate" synchronizer circuit uses two cascaded latch cells, as illustrated in FIG. 2. The simplified synchronizer circuit illustrated in FIG. 2 is the basis for many flip-flop designs commonly found in cell libraries, and consists primarily of two data latches, the "master latch" and the "slave latch." Many designers work with a rule of thumb that "two flip-flops are sufficient to resolve metastability," and hence use a combination of two such circuits for synchronization purposes. An additional scan latch, the "scan out latch," facilitates reading and writing the data flip-flop from a scan chain (e.g., for chip testing purposes). The circuit can be switched between data mode and scan mode by manipulating the three clock signals: the data path clock (CLK); the scan-in clock (SICLK); and the scan-out clock (SOCLK). Note that the synchronizer circuit of FIG. 2 includes approximate transistor sizes (e.g., "1.5×," "3×," etc.) to simplify the explanation of the circuit. These transistor sizes are exemplary, and may vary depending on the type and intended use of the synchronizer circuit.

For the circuit of FIG. 2, when the clock input CLK is low, the master latch is transparent (e.g., ready to sample and store a data value) and the slave is opaque (e.g., not sampling, but instead holding a previously sampled data value). When the clock goes high, the master latch becomes opaque, and the slave latch becomes transparent to effect a positive edge-triggered behavior. When a pass-gate latch is opaque, the inverter and tri-state inverter at the bottom of the latch form a cross-coupled pair (referred to as the "latch keepers") that retains the last value of the D input. If the D input changes at roughly the same time as the rising clock edge, the voltage at the output of the master latch's pass-gate might be at an intermediate value between $V_{dd}$ and ground. The regenerative function of the cross-coupled pair is used to resolve such an intermediate value to a well-defined logical value. Accordingly, the performance of the cross-coupled pair largely determines the effectiveness of the pass-gate latch as a synchronizer.

One limitation of the synchronizer circuit illustrated in FIG. 2 is that the cell is designed specifically using data-path flip-flops that have a low clock-to-Q delay (in this example, the inverted output data signal $\overline{Q}$) and a small setup-and-hold time window. To achieve these performance characteristics, this circuit has relatively large transistors in the forward D-to-Q path. The timing requirements of the latch keepers in the flip-flips that store the logic state are more relaxed, and thus the transistor sizes in the latch keepers are comparatively small (e.g., sizes 1× and 2× in both the master and slave latches, as shown in FIG. 2). The additional circuitry that facilitates scan read and write is designed to have minimal impact on the data-path delay—the only extra loading on the forward data path is from the addition of the 0.5× sized pass-gate operated by the scan-out clock.

As mentioned above, synchronizers need to be able to deal with situations when the input data signal is changing just as the clock is sampling the data value. Delayed flip-flop outputs and metastable output voltages can have severe consequences (e.g., incorrect logic operation) in the circuits driven by the output of the synchronizer. Even though such situations occur fairly infrequently, the occurrence can be frequent enough to become a major system reliability problem in designs with high data rates, high sampling frequencies, and/or large numbers of signals that cross between clock domains.

A synchronizer flip-flop that generates a clean logic 0 or 1 value sufficiently quickly can avoid such reliability issues. However, the physics of the decision-making task can result in internal metastability that occasionally can take a long time to resolve. The function of the latch keeper circuits is to resolve any metastable mid-voltage to valid logic 0 or 1 values and to store these final logic values. Latch keeper circuits with high gain inverters (e.g., larger inverters and a low capacitive load for the four cross-coupled keeper nodes, which are marked with asterisks in FIG. 2) are better at restoring such logic levels. Unfortunately, many of the design features that make for a good data flip-flop result in very poor synchronizer performance; low clock-to-Q delay and short setup-and-hold time windows are much less important design criteria for synchronizer operation. More specifically, the small keeper transistors and the relatively large loads from the data path and scan circuits for the synchronizer circuit of FIG. 2 result in poor synchronizer performance. Improving this circuit for synchronizer use would involve reversing the sizes of the keepers with respect to the data path (e.g., employing small transistors in the data path and scan circuits, and large transistors in the keepers). However, even with such changes, additional issues remain. For instance, using pass gates connected to the critical keeper nodes (marked with asterisks in FIG. 2) also leads to performance issues, because capacitance on the far side of the pass gate is added to the critical node when the pass gate is transparent. Hence, data flip-flops such as the pass-gate flip-flop shown in FIG. 2 are typically poor choices for synchronizers in high-performance system designs.

The following sections describe techniques for quantifying synchronizer robustness and efficiency and disclose embodiments of synchronizer circuits that facilitate reducing metastability during synchronization.

Quantifying Synchronizer Robustness

The ability of a latch to resolve from metastability with a specified settling time is frequently characterized by its mean time between failures (MTBF), which can be estimated by the following equation:

$$MTBF = \frac{e^{\frac{T_s}{\tau}}}{T_w * f_c * f_d},$$

where $T_s$ is the settling time allowed for the output signal of the latch; $f_c$ is the clock frequency; $f_d$ is the average rate of data transitions (e.g., the data change frequency); $\tau$ is the metastability time constant of the circuit, which corresponds roughly to the inverse of the gain-bandwidth product at the metastable voltage of the synchronizer's bistable element (e.g., of the cross-coupled inverters); and $T_w$ is the time window for the synchronizer (e.g., a time window that roughly corresponds to the width of the time interval when the synchronizer is vulnerable to input transitions). The parameters $\tau$ and $T_w$ characterize the performance of the latch to resolve from metastability; both $\tau$ and $T_w$ have units of time, and smaller values for each result in better synchronizers. In particular, latches that have both high gain keepers and low capacitive loading in the cross-coupled nodes typically have a low $\tau$ value.

As mentioned above, design criteria for data flip-flops can favor choosing circuit topologies and device sizes that are far from optimal for maximizing synchronizer robustness. Synchronizers benefit from reducing the $\tau$ of the bistable storage element, while a key property of a flip-flop used within a single clock domain is its clock-to-Q delay. Minimizing a flip-flop's clock-to-Q delay often has the side-effect of maximizing its $\tau$ value. Furthermore, the scan-chains that are included in most flip-flops to improve chip testability further exacerbate this trade-off; inserting the scan logic to minimize the impact on clock-to-Q delay can have a large, deleterious impact on $\tau$.

Note that $\tau$ is also sometimes very sensitive to power supply voltage. When a cross-coupled pair of inverters in a synchronizer is near its metastable voltage, the gate-to-source voltages for both the N-channel and the P-channel transistors of the inverters are both close to $V_{dd}/2$. For deep sub-micron processes, the transistor threshold voltages can be relatively close to this $V_{dd}/2$ voltage. This loss of $V_{dd}$ "headroom" causes the $\tau$ of a cross-coupled CMOS inverter pair to increase much more quickly with decreasing power-supply voltage than the FO4 (fan-out-of-four) delay (e.g., the delay of an unloaded, cross-coupled inverter pair) for logic gates in the same process. This degradation can be particularly severe for low-power processes that typically have relatively high transistor threshold voltages to reduce leakage currents.

Using a Jamb-Latch Circuit in a Synchronizer

Figure 3A:
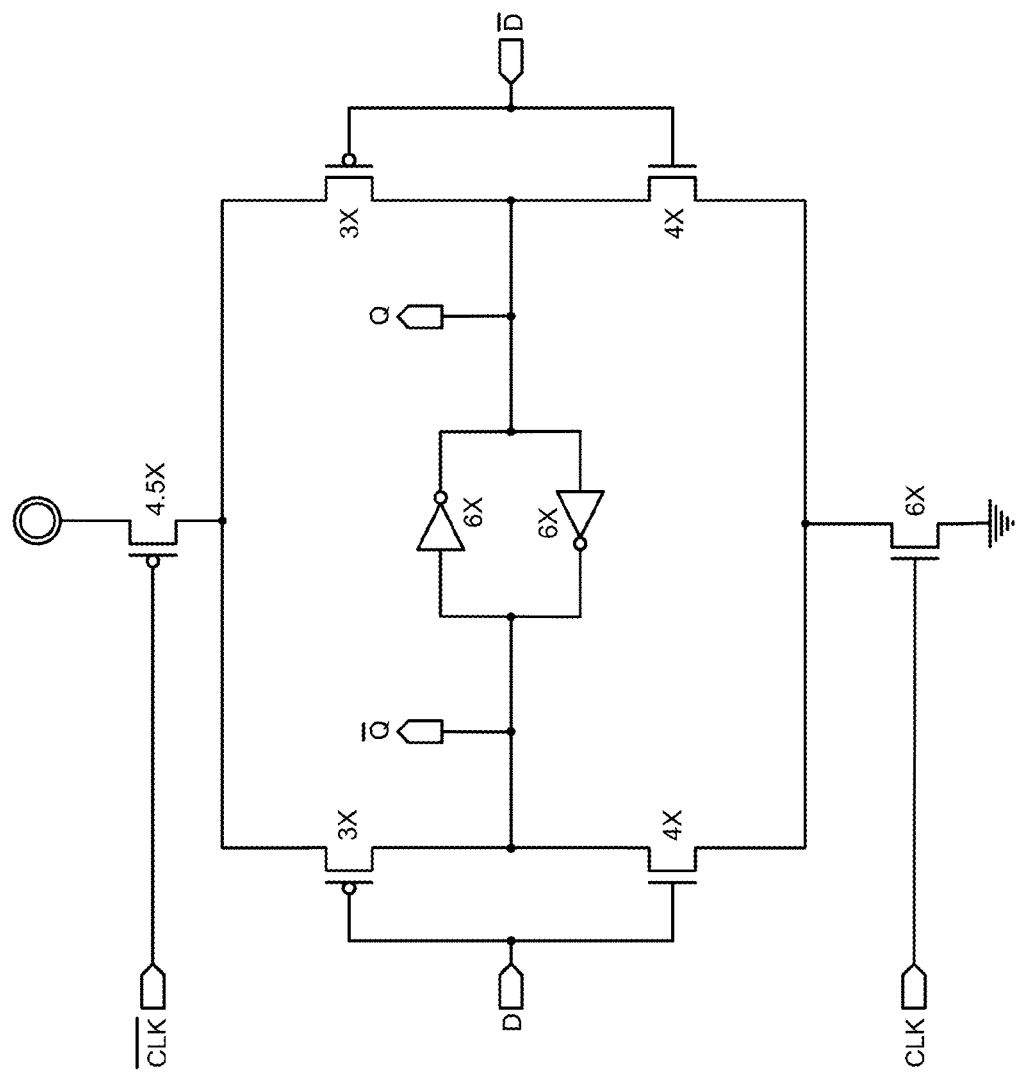
FIG. 3A illustrates a symmetric jamb-latch circuit in accordance with an embodiment.
Figure 3B:
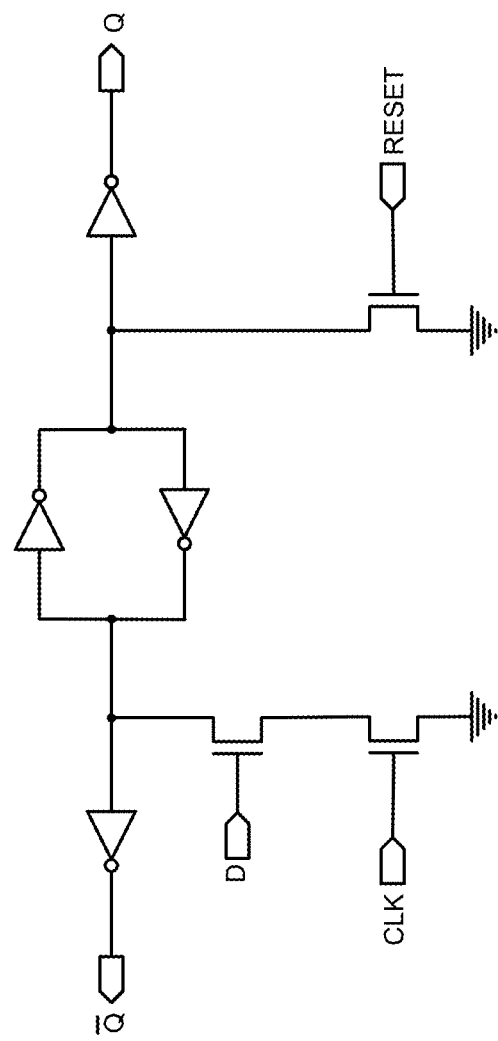
FIG. 3B illustrates an alternative jamb-latch circuit in accordance with an embodiment.
Figure 3C:
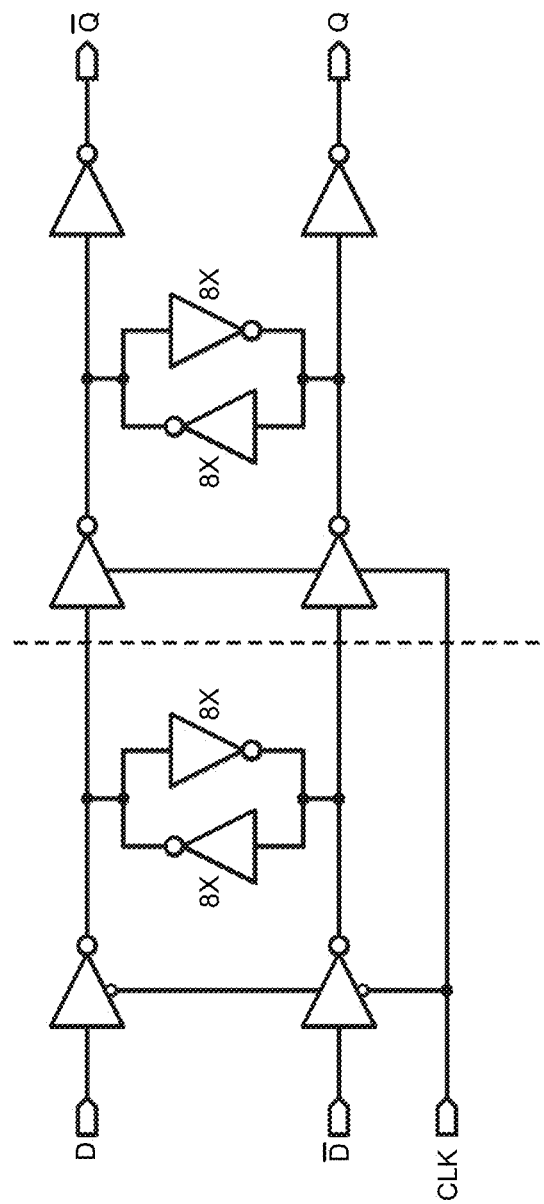
FIG. 3C illustrates a synchronization master-slave flip-flop circuit built using two jamb-latch circuits in accordance with an embodiment.

In some embodiments, jamb-latch circuits can be used as an alternative to data flip-flops in synchronizer circuits. FIG. 3A illustrates a symmetric jamb-latch circuit. FIG. 3B illustrates an alternative jamb-latch circuit. FIG. 3C illustrates a synchronizer master-slave flip-flop circuit built using two jamb-latch circuits.

The bistable element of the jamb latch is a pair of cross-coupled inverters. By eliminating the series-connected transistors of a tri-state-inverter circuit (or in the NAND or NOR gates used in other latch designs), the jamb latch can obtain better metastability resolution performance than a pass-gate latch. Furthermore, the jamb latch is optimized to synchronize rising edges; for example, in the jamb latch of FIG. 3B, the clock-qualified data is used to selectively pull one side of the cross-coupled pair down, and a separate "reset" circuit is used on the other side. The jamb latch of FIG. 3B also exploits the property that N-channel transistors have historically had about twice the drive strength of P-channel devices of the same dimensions. Using only N-channel transistors to set the latch state reduces the load capacitance for the cross-coupled pair.

While jamb latches are well-optimized for larger feature size processes, the assumptions behind their design do not apply for deep sub-micron technologies. For instance, velocity saturation is closing the gap between the drive strength of N-channel and P-channel devices. With $V_{gs} \approx V_{dd}/2$ (roughly the metastable voltage for a cross-coupled inverter pair), the N-channel transistor in a 90 nm process has nearly 2.7 times the drive strength of a P-channel device of the same width, but in a 28 nm process, this ratio drops to only 1.5. Thus, when implemented in a deep sub-micron process, a jamb latch requires impractically large N-channel transistors to set and reset the cross-coupled pair.

For the jamb-latch-based synchronizer circuit of FIG. 3C, tri-state buffers are used to drive the data signal and its complement onto the nodes of the cross-coupled pair. The combined size of the N-channel and P-channel transistors for the tri-state inverters can be less than the total size needed for the corresponding N-channel devices of the jamb latch design of FIG. 3B. This is because the tri-state inverter driving one side of the cross-coupled pair weakens the cross-coupled inverter driving the other side. Obtaining a reliable design may take substantial delicate effort; to minimize the capacitance driven by the cross-coupled pair when resolving metastability, a designer might strive to make the tri-state inverters as small as possible. However, if these inverters are too small, they may fail to change the state of the latch. In general, while the illustrated jamb-latch-based synchronization circuits have a lower τ value than the synchronization circuit of FIG. 2, the switched inverters needed to change the state of the keepers in these circuits need to be of a similar size to the cross-coupled keeper inverters, adding significant capacitive load to the critical nodes.

Embodiments of the present invention provide synchronization circuits that out-perform synchronizers based on data flip-flops and jamb latches.

A New Synchronizer Latch Circuit

Some embodiments of the present invention leverage a new latch circuit to create a much-improved synchronization master-slave flip-flop that dramatically improves synchronizer performance. Note that in the following description, a latch circuit is able to store a single bit, while a flip-flop comprises a pair of cascaded latches that are typically arranged in a master-slave arrangement.

Figure 4A:
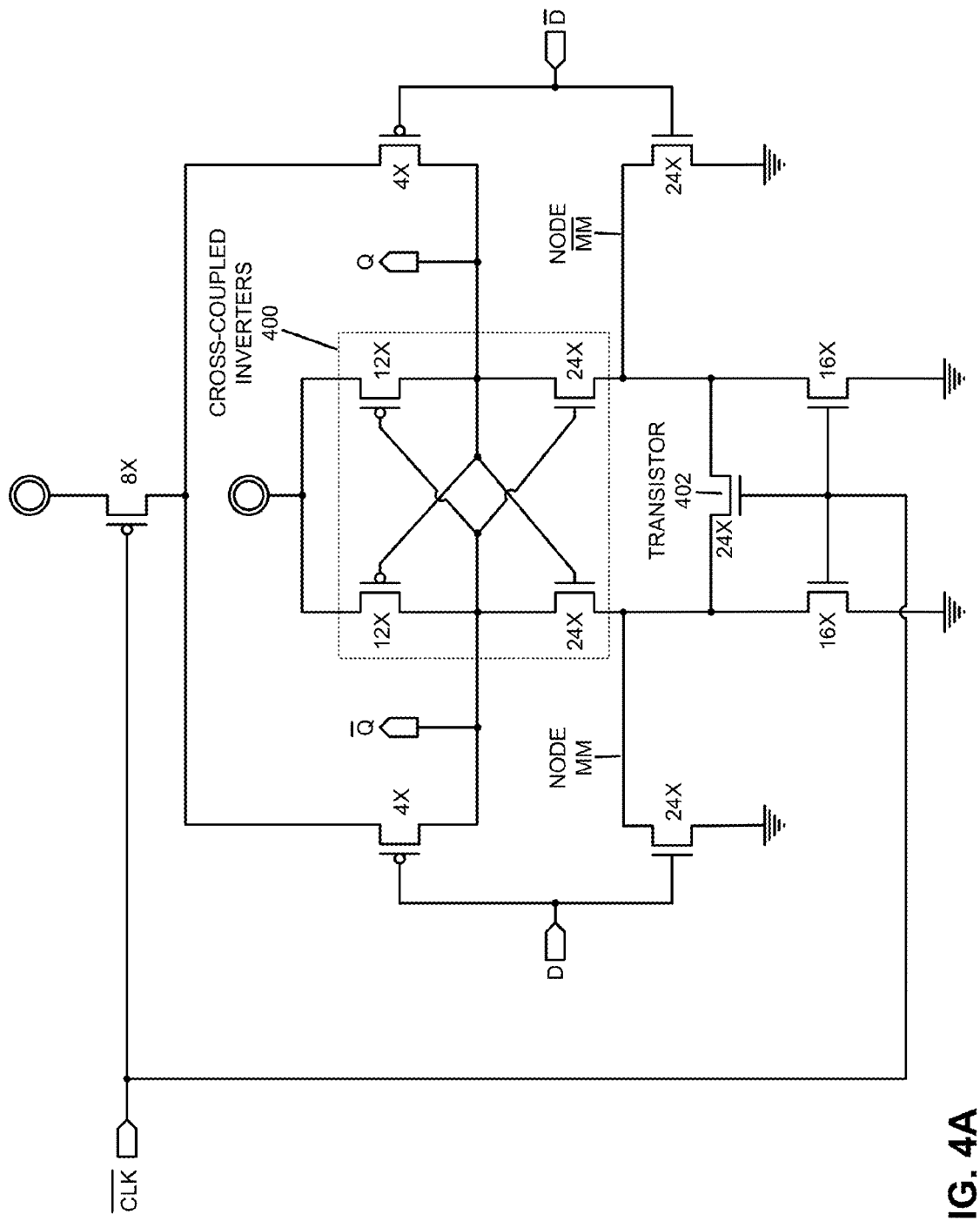
FIG. 4A illustrates an exemplary synchronizer latch circuit that improves synchronizer performance in accordance with an embodiment.

FIG. 4A illustrates an exemplary latch circuit that improves synchronizer performance. Note that while FIG. 4A includes a set of exemplary transistor sizes (where PMOS sizes are for a P/N ratio of 1.2), transistor sizing may be constrained by circuit layout constraints and process technology. Hence, a range of sizes may be used to build synchronization circuits with substantially similar synchronization characteristics. Note also that, as would be apparent to one skilled in the art, a substantially similar synchronizer circuit can be obtained by replacing all of the illustrated PMOS transistors with NMOS transistors, replacing all of the illustrated NMOS transistors with PMOS transistors, and exchanging the power supplies and grounds of the illustrated circuit.

The exemplary latch circuit of FIG. 4A uses a pair of cross-coupled inverters 400 that are enabled by $\overline{CLK}$ and form a metastable resolving and state-holding element. The cross-coupled output nodes (labeled Q and $\overline{Q}$ in FIG. 4A) are lightly loaded, which keeps the τ value for the circuit low. More specifically, in addition to the (ideally small) capacitive load of any circuits and wires driven by the Q and $\overline{Q}$ signals, there are just two additional small PMOS transistors driving these metastable resolving nodes. The data input uses the dual-rail complementary input signals D and $\overline{D}$ to each drive both a 4× PMOS pull-up transistor and a 24×NMOS pull-down transistor. Note especially that the large 24×NMOS transistors driven by D and $\overline{D}$ are used for enabling one of the cross-coupled inverters rather than for forcing a state change on the Q and $\overline{Q}$ nodes (as in the jamb-latch design described above). Using these large 24× NMOS transistors to enable one of the cross-coupled inverters greatly reduces the capacitance on the nodes Q and $\overline{Q}$, thereby lowering the τ value of the latch, and thus improving its synchronizer performance. Note also that increasing the size of these two pull-down NMOS transistors lowers the τ value of this latch, although this decision involves a design trade-off, because larger transistors increase the loading on the data inputs.

Consider the operation of the new synchronizer latch illustrated in FIG. 4A. When this latch is "transparent" (i.e., when $\overline{CLK}$ is LO), the latch evaluates the data input signal (and its complement), and only one of the cross-coupled inverters is enabled (e.g., one of the cross-coupled inverters is enabled by the data input D or its complement and $\overline{D}$ turning on either the left- or right-hand 24×NMOS pull-down transistor). If D is HI, $\overline{D}$ is LO. In this case, the left-hand inverter is enabled (i.e., the left cross-coupled 24×NMOS pull-down transistor is enabled) and node Q is weakly pulled HI via the series combination of the 8×PMOS transistor driven by $\overline{CLK}$ and the 4×PMOS transistor driven by D. The combination of D being HI and Q being HI results in $\overline{Q}$ being strongly pulled LO. Feedback from $\overline{Q}$ via the (12×) pull-up PMOS transistor in the "disabled" right-hand inverter causes node Q to now be strongly pulled HI. Similarly, the reverse situation occurs when D is LOW and $\overline{D}$ is HI, resulting in Q being strongly pulled LOW and $\overline{Q}$ being strongly pulled HI.

When $\overline{CLK}$ switches from LOW to HI, the latch changes from "transparent" to "opaque," storing the state of Q and $\overline{Q}$. With $\overline{CLK}$ HI the 8× PMOS transistor driven by $\overline{CLK}$ is off; thus, neither of the 4×PMOS transistors driven by D and $\overline{D}$ will pull the output nodes HI. Concurrently, the nodes labeled MM and $\overline{MM}$ become virtual grounds (e.g., both of the 16×NMOS transistors driven by $\overline{CLK}$ are turned on, and both of the cross-coupled inverters are enabled, thus strongly holding the state of the Q and $\overline{Q}$ nodes). Under these conditions, the 24×NMOS transistor 402 driven by $\overline{CLK}$ that connects between the pull-down legs of the cross-coupled inverters (e.g., between nodes MM and $\overline{MM}$) is turned on, thereby helping reduce the impedance to ground of the MM and $\overline{MM}$ nodes. More specifically, because one of D and $\overline{D}$ will always be HI, transistor 402 connecting between the two 16×NMOS pull-down transistors facilitates making MM and $\overline{MM}$ stronger virtual grounds. In particular, if D is HI, then node MM is pulled LOW by the parallel combination of 16× and 24×NMOS transistors, effectively providing 40× of NMOS pull-down. Under these same conditions, node $\overline{MM}$ is pulled LOW by the parallel combination of 16× and two 24×NMOS transistors in series, thereby effectively providing 28× of NMOS pull-down. Note that because MM and $\overline{MM}$ are non-critical nodes, including transistor 402 does not impact performance. There is, however, a size trade-off for transistor 402—a larger size helps reduce the impedance to ground, but results in a larger layout and greater clock loading. In some embodiments, a 24× size serves as a reasonable compromise.

Consider a synchronization scenario where D and $\overline{D}$ are roughly at mid-supply (e.g., an intermediate voltage) when $\overline{CLK}$ switches from LOW to HI. In this situation, both Q and $\overline{Q}$ will be at a voltage that is also roughly at about mid-supply. Once $\overline{CLK}$ becomes HI, both cross-coupled inverters are fully enabled and start to resolve these metastable voltages to valid logic levels. As shown in detail later, this circuit has a lower $\tau$ value, and hence resolves more rapidly than the pass-gate circuit of FIG. 2. For example, in a 28 nm process, with $f_c$=3.5 GHz and $f_d$=0.5 GHz, this improved synchronizer latch design in a two stage synchronizer is estimated to have an MTBF that is more than 7 orders of magnitude greater than a corresponding circuit built using data flip-flops (e.g., the circuit of FIG. 2).

Figure 5:
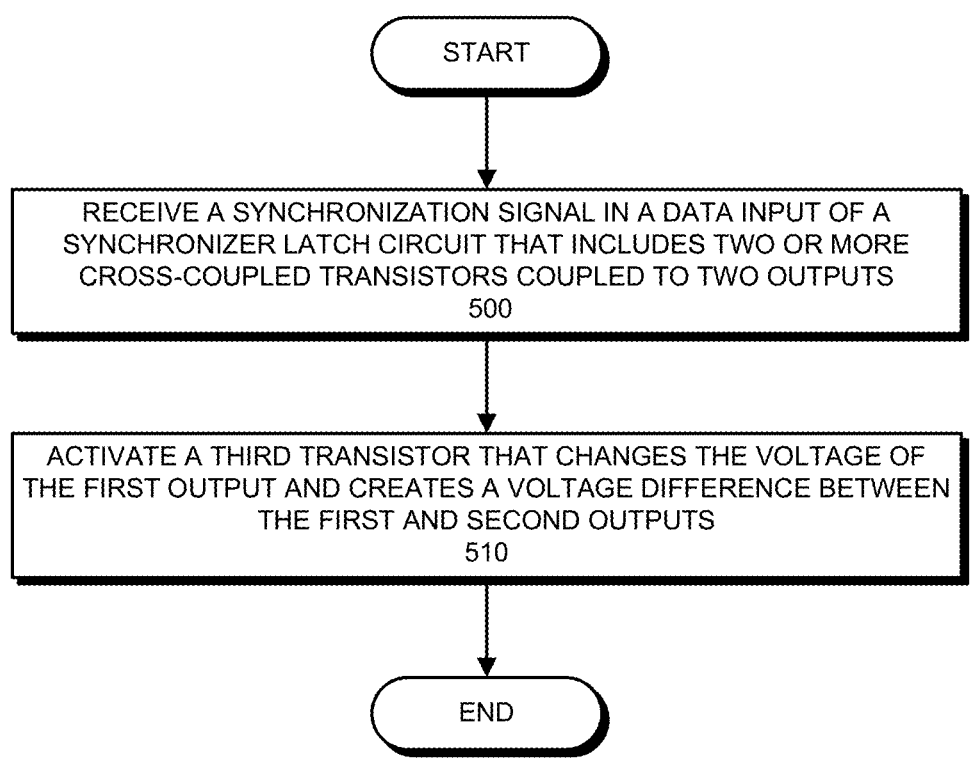
FIG. 5 presents a flow chart that illustrates the process of using a synchronizer latch circuit to resolve metastability in accordance with an embodiment.

FIG. 5 presents a flow chart that illustrates the process of using a synchronizer latch circuit to resolve metastability. The synchronizer latch circuit includes a first output, a second output, and three or more transistors. Two or more of the transistors are cross-coupled. The gate of a first cross-coupled transistor is coupled to the second output, the gate of a second cross-coupled transistor is coupled to the first output, the drain of the first cross-coupled transistor is coupled to the first output, and the drain of the second cross-coupled transistor is coupled to the second output. A data input is coupled to the gate of a third transistor. During operation, the synchronizer receives a synchronization signal at the data input (operation 500). This synchronization signal activates the third transistor to change the voltage of the first output and create a voltage difference between the first and second outputs (operation 510), thereby resolving metastability issues even when the data input arrives inside the setup-and-hold time window of the synchronizer latch circuit.

Incorporating the New Synchronizer Latch Circuit into a Synchronizer Cell

Figure 4B:
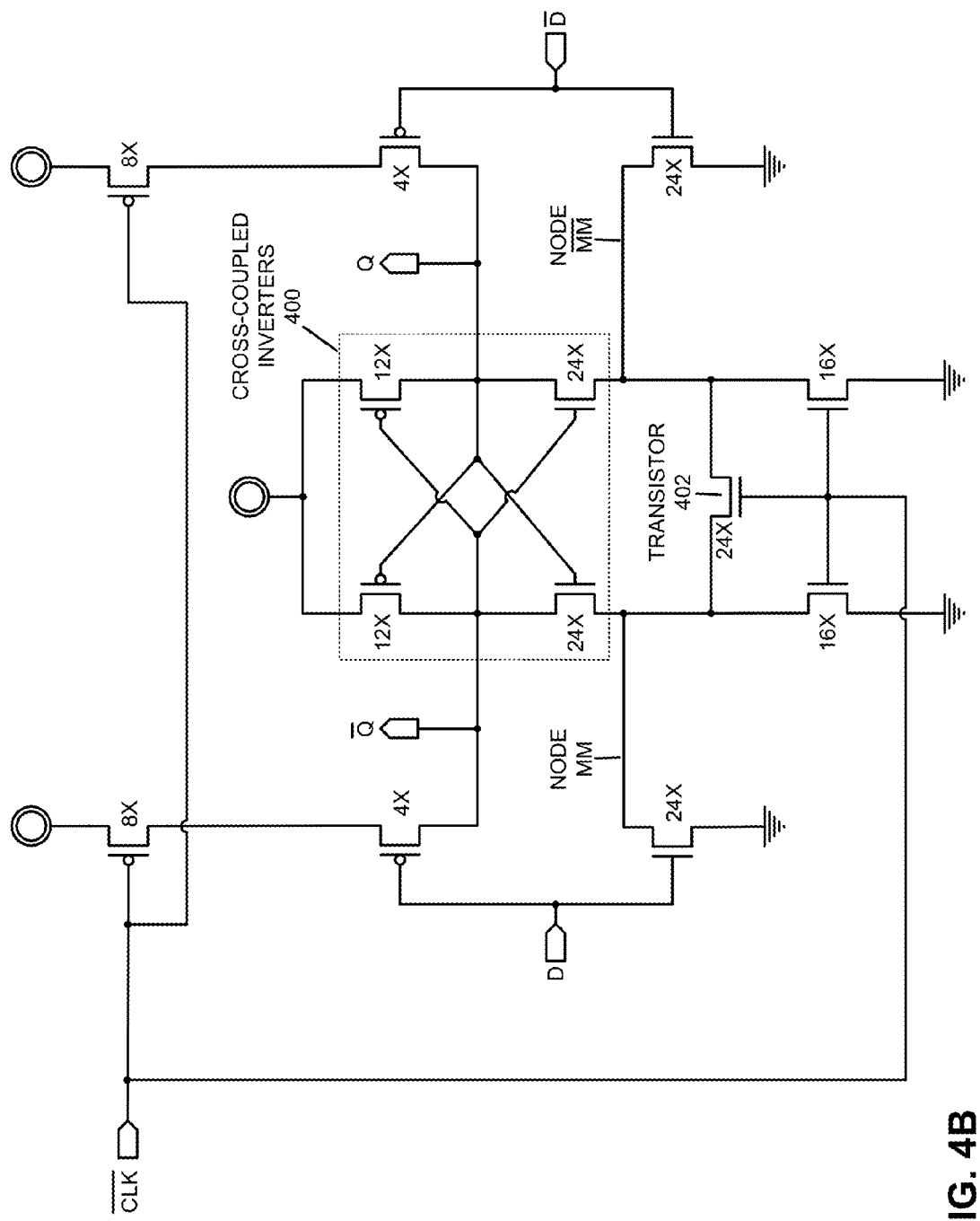
FIG. 4B illustrates an exemplary synchronizer latch circuit in which a pull-up transistor is replicated to reduce noise susceptibility in accordance with an embodiment.

In some embodiments, a low-$\tau$-value latch forms the foundation for building a complete multiple stage synchronizer cell for a production cell library. Note that building a synchronizer cell for a library involves working within the constraints of logic design tools and layout rules for library cells. One such constraint involves reducing long wires in the layout that, during normal logic operation, may be floating, and thus susceptible to noise signals. To address this issue for the circuit of FIG. 4A, the 8× pull-up PMOS transistor driven by $\overline{CLK}$ can be replicated, with each of the two resulting pull-up transistors being located adjacent to its connected 4×PMOS transistor (as shown in FIG. 4B). Note that duplicating the pull-up transistor does not impact circuit operation, but does increase clock loading slightly; in some implementations, this modification may be a reasonable design compromise.

Production cells typically incorporate scan circuits that facilitate reset, chip testing, and debug. Many commercial design flows require all flip-flops to be scannable to improve the controllability and observability of the circuits on the chip for test. However, adding scan capabilities to a flip-flop can significantly degrade its performance as a synchronizer. While there are designs for which scannable synchronizer flip-flops may contribute little to observability, scan capabilities may still make a valuable contribution to controllability.

Some embodiments seek to limit the negative performance effects of scan capabilities by providing both fully scannable synchronizer cells as well as partially scannable synchronizer cells in which only a subset of synchronizer stages include scan circuitry. In some embodiments, rather than having multiple synchronizer options, the set of available production synchronizer cells may include only a single standard cell that includes scan capabilities for each of a few fixed length synchronizers (such as a 2-stage and a 3-stage synchronizer).

Figure 4C:
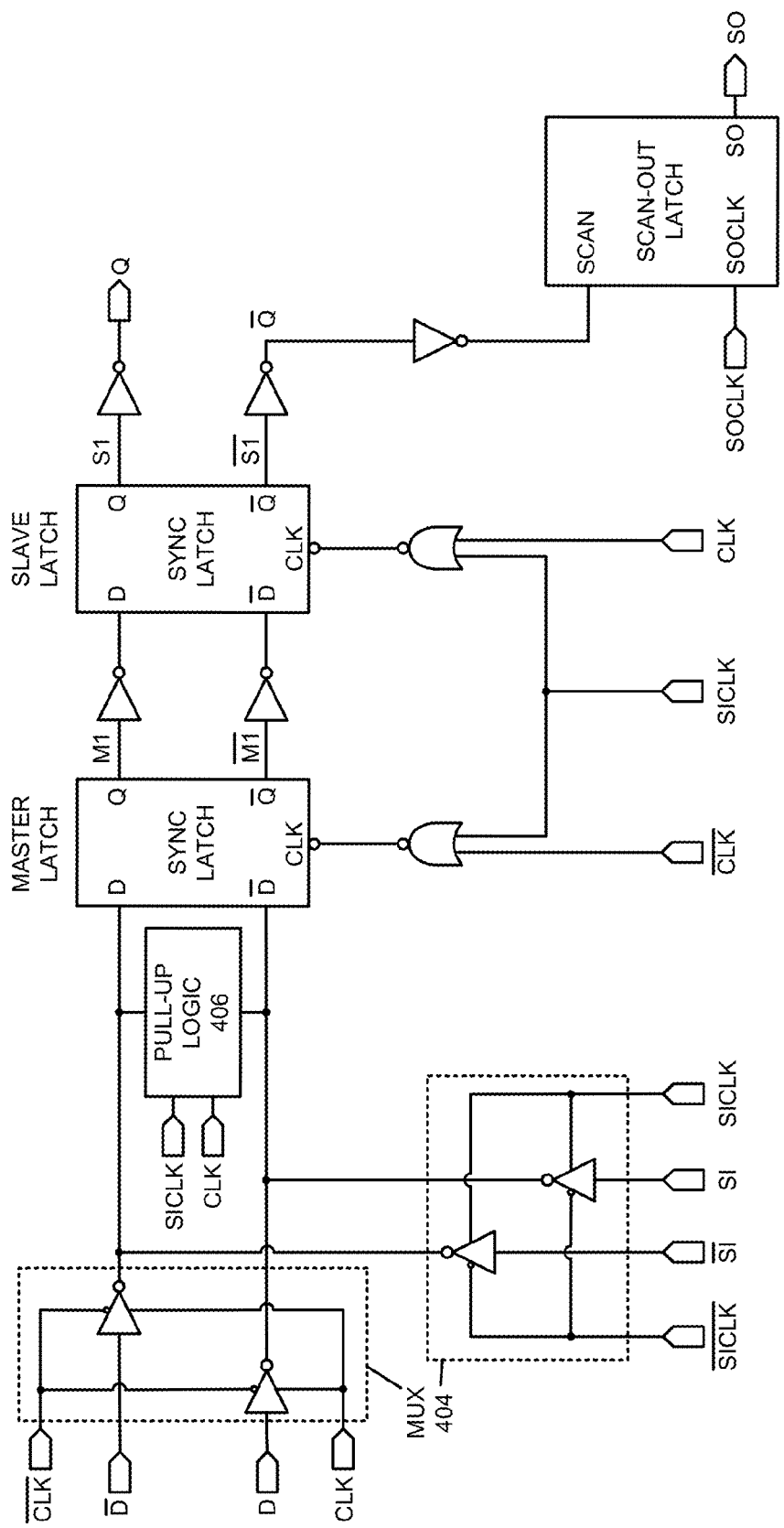
FIG. 4C illustrates a scannable synchronizer master-slave flip-flop cell based on the synchronizer latch circuits of FIGS. 4A-4B in accordance with an embodiment.

FIG. 4C illustrates a scannable synchronizer flip-flop cell based on the synchronizer latch of FIGS. 4A-4B. This flip-flop cell comprises master and slave latches surrounded by scan circuits. The master and slave latches are coupled by small inverters that shield the output nodes (M1, $\overline{M1}$, S1 and $\overline{S1}$) from the wires and capacitive loads driven by the latches.

In a data-path flip-flop, the scan circuits are typically connected either directly to the cross-coupled inverters in the master latch or directly to the cross-coupled inverters in the slave latch (as illustrated in FIG. 2). In either case, such scan circuit connections add significant load to the metastable resolving nodes and reduce the gain of the cross-coupled latch elements, which dramatically degrades synchronizer performance. In some embodiments, scan functionality can be added without impairing synchronizer performance by multiplexing between data and scan input signals just before the master latch cell (as illustrated in FIG. 4C using a multiplexer (mux) 404 composed of switchable tri-state inverters), thus avoiding additional loading on the cross-coupled nodes in the master latch. A scan-out latch is connected via a small inverter to the "unused" $\overline{Q}$ output of the slave latch. The cell illustrated in FIG. 4C behaves functionally identically (including scan) to the circuit illustrated in FIG. 2. Note that mux 404 is in the flip-flop data path, which increases D-to-Q forward data delay and hence reduces synchronizer performance by a small amount when multiple flip-flops are cascaded. While this reduction in synchronizer performance subtracts from the total metastability resolution time between adjacent flip-flops, in some embodiments using mux 404 has a smaller impact on synchronizer performance than other techniques for adding scan capabilities to the synchronizer circuit.

In some embodiments, the main clock (CLK) and the scan-in clock (SICLK) are OR'd together to facilitate clocking. During scan mode, the data paths of both the master and slave latches are clocked together by the scan-in clock. This arrangement allows mux 404 to be placed in the incoming data path, where mux 404 does not affect the metastability resolving time between the master and slave latches. Both the master and slave latches can be clocked together in scan mode because during scan mode the data clock (CLK) is held LO. At the end of each scan-in clock tick, when SICLK is LO, the master latch returns to being transparent.

The clocking of the synchronizer circuit can involve some potential complications. As mentioned above, the manner in which the scan circuitry is connected internally in the synchronizer cell results in just a slight reduction in synchronizer performance. However, for the data path through the flip-flop, ORing together the data and scan-in clocks results in an additional NOR gate delay in the overall clock-to-Q delay of this flip-flop. This additional delay may be unacceptable for the last flip-flop in a multiple flip-flop synchronizer cell, where minimum clock-to-Q delay is desired. An alternative circuit implementation of the latch cell of FIG. 4A can achieve this OR function of the two clocks by duplicating the four transistors connected to $\overline{CLK}$ (e.g., where one of the resulting sets are driven by $\overline{CLK}$, and the other set are driven by $\overline{SICLK}$). However, in some instances this alternative may make the cell layout too large. Another alternative implementation is to build an N-stage flip-flop synchronizer that uses the new synchronizer flip-flop (of FIGS. 4A-4B) for the first N−1 stages and a conventional pass-gate flip-flop cell that optimizes clock-to-Q (e.g., as shown in FIG. 2) for the last stage. Such an implementation can serve as a reasonable compromise, because the last stage of the synchronizer often does not contribute much to the overall MTBF value of a typical synchronizer deployment (e.g., due to the logic synthesis tools filling the clock cycle that follows the synchronizer with combinational logic). Furthermore, using a conventional data flip-flop cell with a shorter clock-to-Q delay in the final stage reduces the likelihood that some of the combinational logic following the synchronizer might "spill over" into an additional clock cycle (e.g., requiring an additional pipeline stage, which would be extremely undesirable in low-latency designs).

Note that FIG. 4C includes additional pull-up logic 406 on the inputs of the master latch. In some embodiments, pull-up logic 406 can comprise four pull-up PMOS transistors that prevent floating nodes at the output of the mux 404 that selects between the data path and the scan path. Pull-up logic 406 ensures that these nodes do not float when neither set of inputs is selected (e.g., when both the data clock and the scan-in clock are LO).

Figure 4D:
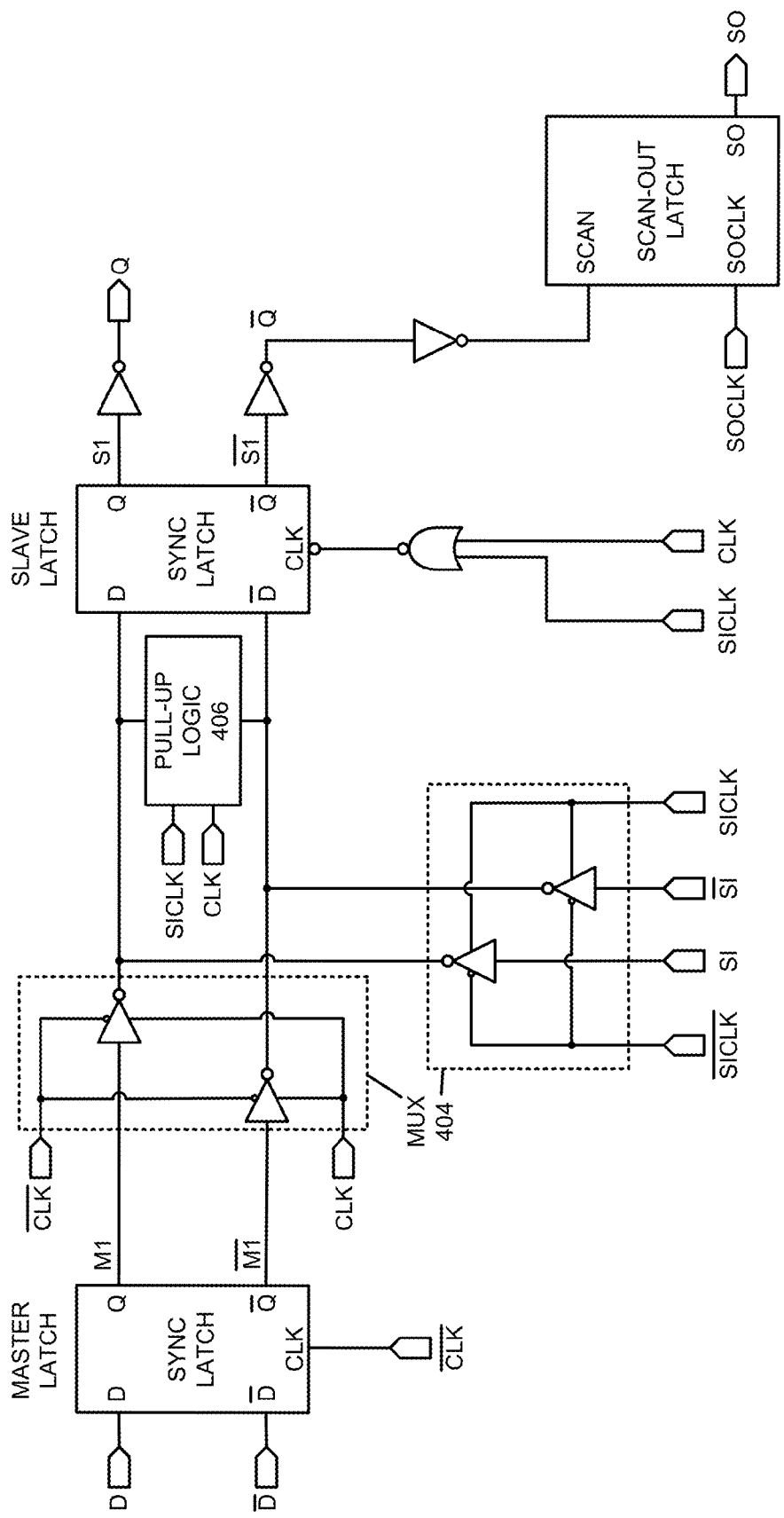
FIG. 4D illustrates an alternative scannable synchronizer master-slave flip-flop cell based on the synchronizer latch circuits of FIGS. 4A-4B in accordance with an embodiment.

FIG. 4D illustrates an alternative embodiment of a scannable synchronizer cell in which the mux 404 that couples the scan-in to the flip-flop is located between the master and slave latches (in contrast to the cell of FIG. 4C, where mux 404 is located before the master latch). This implementation reduces clock loading and makes the scan path through the flip-flop circuit as similar as possible to comparable data flip-flop cells (e.g., the cell illustrated in FIG. 2). The performance of the illustrated synchronizer cell implementation is comparable to the performance of the synchronizer cell of FIG. 4C. Note that in the implementation illustrated in FIG. 4D, only the slave latch is clocked during scan mode. During normal operation, if this flip-flop starts with a low clock input, the master latch is transparent and only the slave latch is storing a value. Thus, only the slave latch needs to be in the scan path.

Figure 4E:
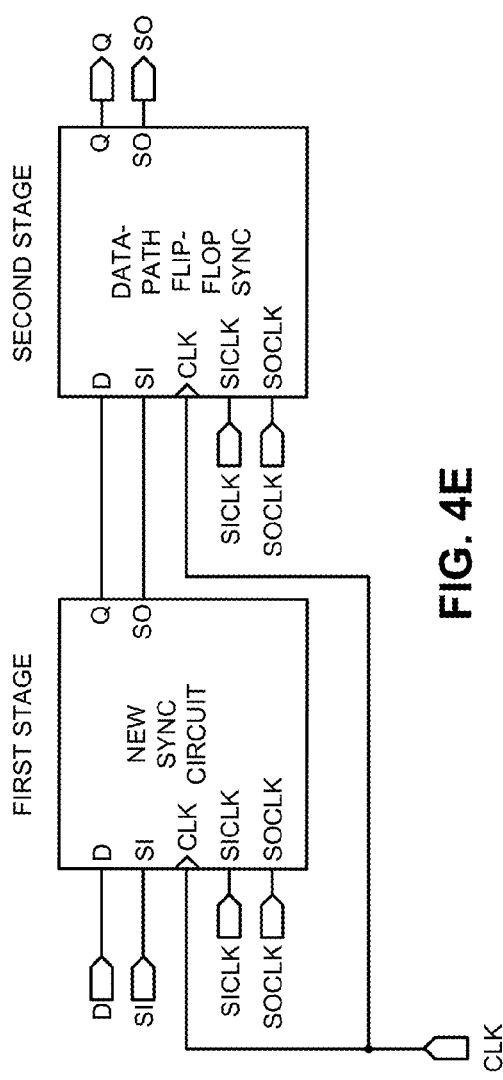
FIG. 4E illustrates a two-stage synchronizer cell that uses the synchronizer latch cell of FIGS. 4C-4D in accordance with an embodiment.
Figure 4F:
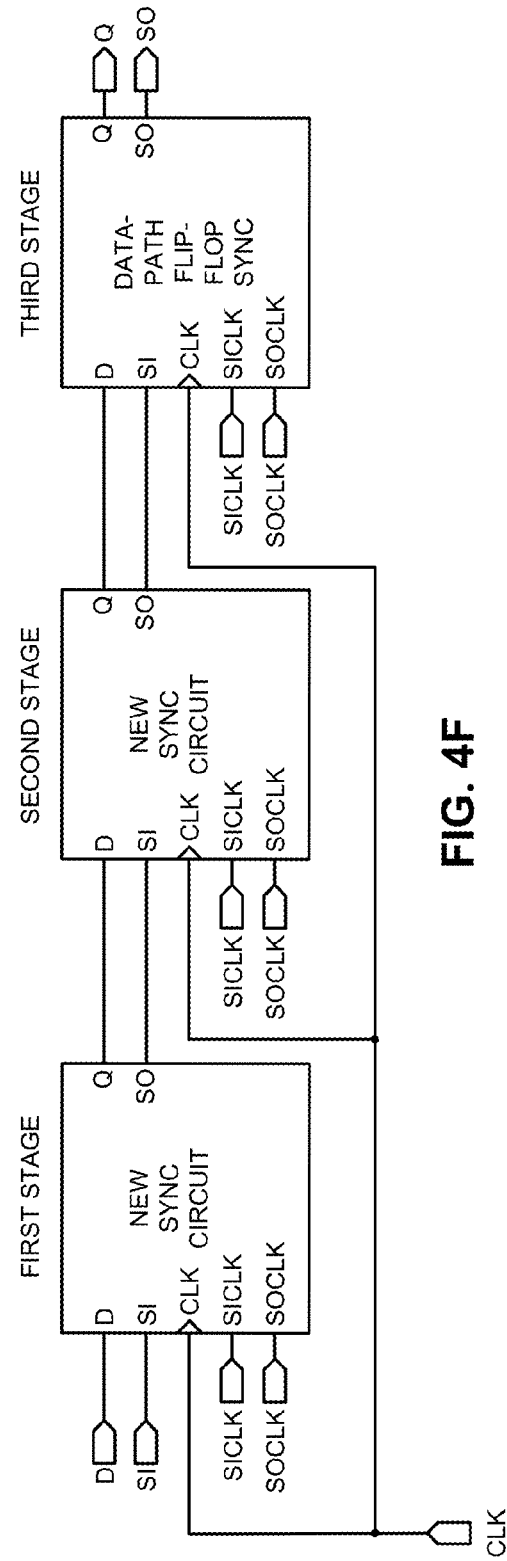
FIG. 4F illustrates a three-stage synchronizer cell that uses the synchronizer latch cell of FIGS. 4C-4D in accordance with an embodiment.

FIGS. 4E-4F illustrate two multi-stage synchronizer cells in which the last stage is a conventional data-path flip-flop (e.g., such as a pass-gate synchronizer) that maintains a desired low clock-to-Q output delay. FIG. 4E illustrates a two-stage synchronizer cell in which the first stage comprises the disclosed new synchronizer latch circuits (e.g., the synchronizing flip-flops illustrated in FIGS. 4C-4D), while the second stage comprises a conventional data-path flip-flop (as illustrated in FIG. 2). FIG. 4F illustrates a three-stage synchronizer cell in which the first and second stages comprise the disclosed new synchronizer latch circuits and the third stage comprises a conventional data-path flip-flop.

Performance of the New Synchronizer Latch Circuit

Figure 6A:
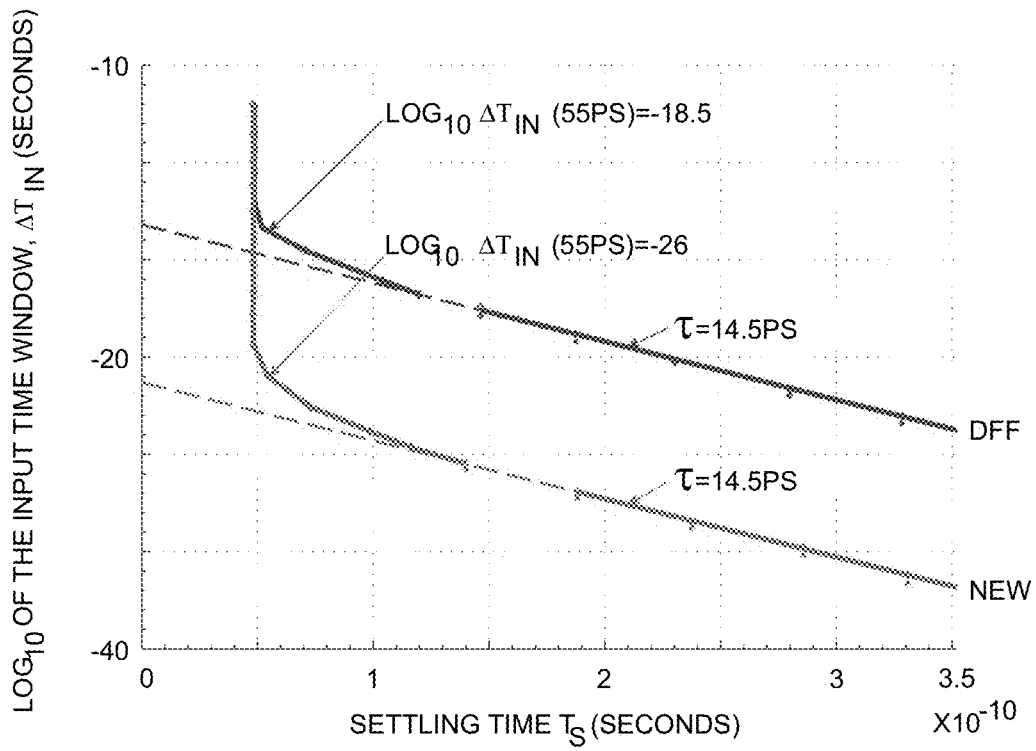
FIG. 6A illustrates a performance comparison between a data flip-flop synchronizer and a two-stage synchronizer that includes the synchronizer latch circuit of FIGS. 4A-4B in accordance with an embodiment.
Figure 6B:
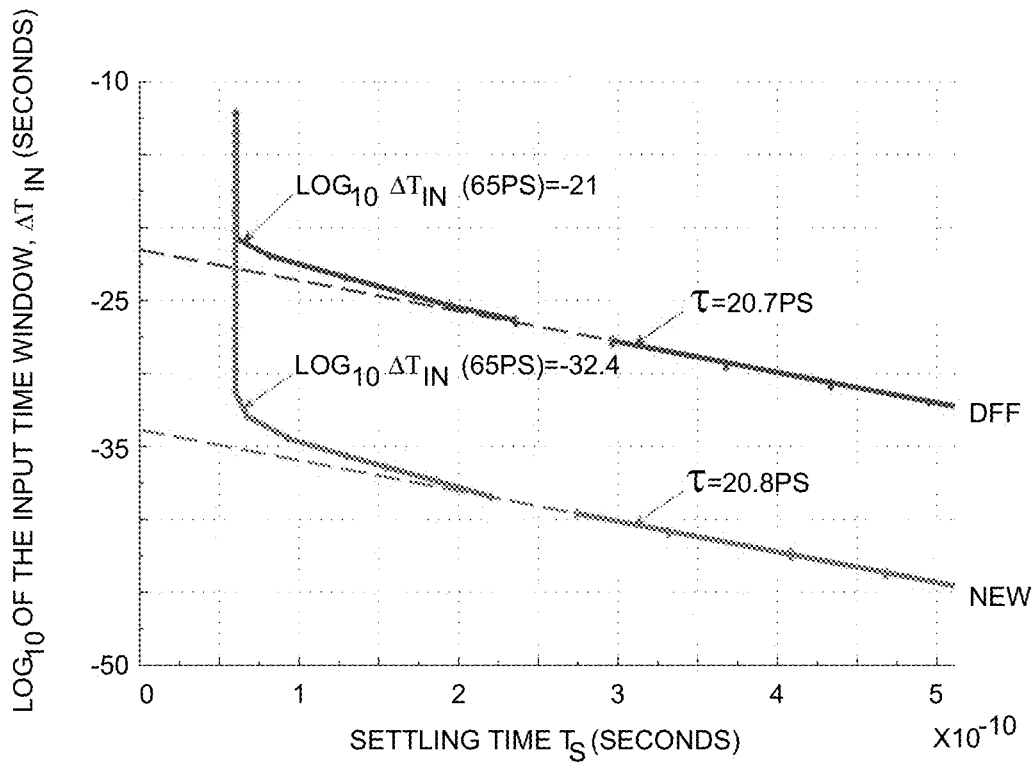
FIG. 6B illustrates a second performance comparison between a data-flip-flop-based synchronizer and a two-stage synchronizer that includes the synchronizer latch circuit of FIGS. 4A-4B in accordance with an embodiment.

FIGS. 6A-6B compare performance characteristics of a two-stage data-path flip-flop synchronizer (DFF) with a two-stage synchronizer (NEW) that includes one stage with a pair of new synchronizer latch circuits followed by a second stage conventional data-path flip-flop synchronizer. FIG. 6A illustrates the characteristic performance of a synchronizer sampling at 3.5 GHz. FIG. 6B illustrates the performance of a synchronizer sampling at 2.0 GHz with a lower supply voltage. FIGS. 6A-6B show the data arrival time window $\Delta T_{IN}$ (on a log scale) versus the output settling time $T_s$ of the synchronizer. In these figures, a reduction in time window size of one unit on the y-axis corresponds to 10× improvement in synchronizer performance. For these circuits, in FIG. 6A the nominal clock-to-Q delay is 48 ps, and the maximum permitted clock-to-Q delay, resulting from internal metastability within the synchronizer, is 55 ps. In FIG. 6B, the nominal clock-to-Q delay is 58 ps due to a lower $V_{dd}$.

As illustrated in FIGS. 6A-6B, the new synchronizer cell offers significant performance improvements. For instance, in FIG. 6A the new synchronizer offers about 7.5 orders of magnitude greater MTBF. Similarly, in FIG. 6B the new synchronizer offers over 11 orders of magnitude greater MTBF. These improvements can have significant impacts on chip reliability. For example, this improvement dramatically boosts the MTBF for a two-stage synchronizer in a 2 GHz clock domain from 4 years to $5*10^{18}$ years. In another design, these improvements boost the MTBF for a two-stage synchronizer in a 2 GHz clock domain from 11 minutes to $4*10^6$ years. Note that in a system with many synchronizers, the overall system MTBF is the individual synchronizer MTBF divided by the number of synchronizers (e.g., a system containing 100 synchronizers, each having an MTBF of $10^7$ years, will have an overall system MTBF of $10^5$ years). Hence, improving the performance of synchronizer designs becomes increasingly important as the number of synchronizers in a system increases, to ensure that a low system MTBF does not lead to reliability issues.

A Variation on the New Synchronizer Latch Circuit

A synchronizer is, in a sense, a variant of a sense amplifier. A synchronizer takes the small voltage difference on the nodes of a bistable element and amplifies this to a full-swing signal. Like a sense-amplifier, synchronizers use regenerative circuits, and rapid regeneration is a central design objective. The principle difference between a synchronizer and a sense amplifier is that, for most sense amplifier designs, minimizing the offset voltage is also an important concern. For a synchronizer, offset voltage is relatively unimportant; as long as the synchronizer correctly acquires full-swing signals, it can resolve other values arbitrarily. Thus, synchronizer circuits do not require the offset trimming circuits that are common in sense amplifiers.

Synchronizers are typically used in chains to achieve a desired MTBF. In most applications, the final flip-flop in the chain makes a negligible contribution to resolving metastability. Standard CAD tools treat the output of a synchronizer as the output of a flip-flop, and timing analysis tools assume that this output settles within the nominal clock-to-Q delay after the clock edge. The only purpose of the earlier latches in the chain, in contrast, is to resolve metastability. A clear voltage difference is established by a bistable synchronizer element that can quickly be resolved to a full-swing signal. These observations motivate the implementation of a synchronizer as a chain of n latches where the first n−2 latches are designed to resolve metastability as effectively as possible. These stages do not need to generate full-swing signals, and the coupling between them can be engineered to minimize the loading on the bistable elements. The last two latches of the chain implement a traditional flip-flop to satisfy the timing and voltage level requirements of standard digital design.

Figure 7B:
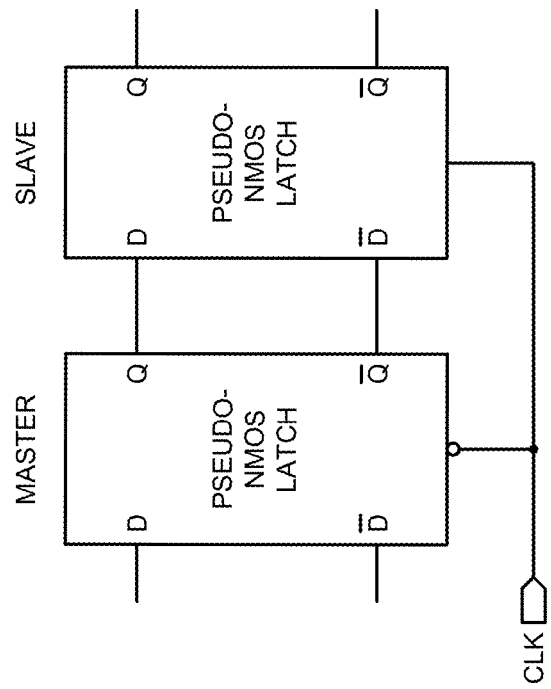
FIG. 7B illustrates the combination of two pseudo-NMOS latches into a synchronizing master-slave flip-flop in accordance with an embodiment.
Figure 7A:
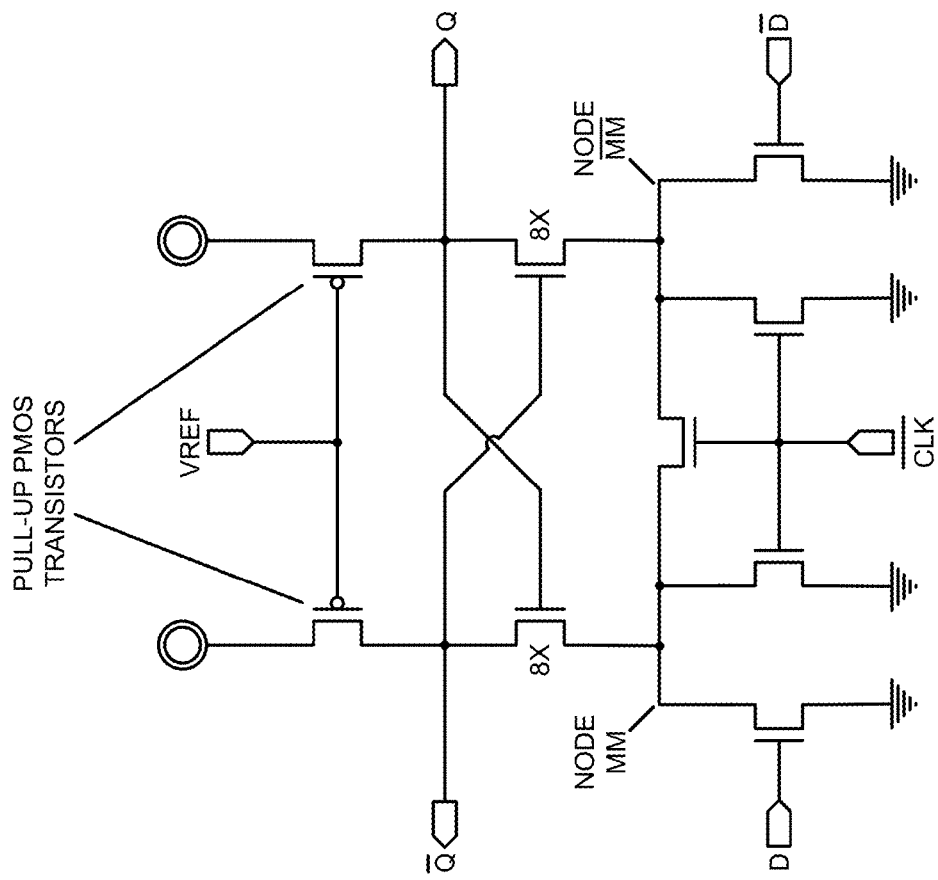
FIG. 7A illustrates a pseudo-NMOS latch in accordance with an embodiment.

In some embodiments, the above observations motivate the design of another variation of the previous new synchronizer latch circuit. This latch, which is called a "pseudo-NMOS latch," is illustrated in FIG. 7A. Where the new synchronizer latch circuit of FIG. 4A includes two cross-coupled inverters with virtual grounds, the pseudo-NMOS latch has only cross-coupled NMOS devices and two small PMOS devices with bias voltages. This organization reduces the capacitive loading on the bistable storage elements. FIG. 7B illustrates how two such latches can be combined to make a synchronizing flip-flop.

The pseudo-NMOS latch takes into account the impact of the circuit topology and limited $V_{dd}$ headroom. When used in a synchronizer chain, this latch achieves τ values that are close to those of an unloaded, cross-coupled inverter pair. The topology of the circuit allows a scannable design with minimal impact on its performance. By using a "pseudo-NMOS" circuit style, this latch is also much less sensitive to low $V_{dd}$ values than existing designs. The features of the pseudo-NMOS latch lead to a synchronizer with a τ value that is about half that of a synchronizer constructed from conventional data-path flip-flops (and close to the τ value of an unloaded inverter). As a result, this design only needs about half as many stages to achieve the same MTBF as a traditional synchronizer, and hence has about half the latency. These characteristics translate directly to increased performance for many systems.

For the pseudo-NMOS latch of FIG. 7A, when the clock signal (CLK) is high (i.e., $\overline{CLK}$ is low), pull-down transistors controlled by input signals D and $\overline{D}$ establish a voltage difference on output signals Q and $\overline{Q}$, respectively. More specifically, during the clock phase when $\overline{CLK}$ is low, both PMOS transistors are conducting, pulling both Q and $\overline{Q}$ toward $V_{dd}$. If D is high and $\overline{D}$ is low, then the ground connection (e.g., the virtual ground) enabled by D pulls $\overline{Q}$ low, while Q remains high. This results in a clear high value on Q, while $\overline{Q}$ settles to some lower value. When CLK goes low (and $\overline{CLK}$ goes high), the latch becomes opaque, and the regenerative action of the cross-coupled NMOS transistors brings the outputs to clearly separated logical values. For instance, when CLK goes low, if D is high and $\overline{D}$ is low, the large pull-down transistors gated by $\overline{CLK}$ solidly conduct, and the bistable pair settles with Q high and $\overline{Q}$ close to ground. The behavior when D is low and $\overline{D}$ is high is equivalent. If D and/or $\overline{D}$ change or have ill-defined values when CLK goes low (e.g., due to sampling the input signals just as the D and $\overline{D}$ signals are changing), any voltage mismatch between Q and $\overline{Q}$ is regeneratively multiplied (i.e., resolved).

Because the pseudo-NMOS latch responds to the difference in the voltages of D and $\overline{D}$, these input voltages do not necessarily need to be full-swing signals. This allows the Q and $\overline{Q}$ outputs of one pseudo-NMOS latch to be connected directly to the D and $\overline{D}$ inputs of the next latch in the chain. Because the latch only has to drive a pair of NMOS transistors, the capacitive load on the bistable pair is significantly lower than that of the inverters that are driven by most other synchronizer circuits. Furthermore, the use of small passive PMOS pull-ups reduces the capacitance on nodes Q and $\overline{Q}$, because the gates of the PMOS transistors do not load these nodes. Finally, applying the input signal to steering nodes MM and $\overline{MM}$ avoids adding capacitance from the input circuit to the key nodes of the bistable pair. These design choices result in a circuit with a very low capacitive load on these nodes, and hence a very low τ value.

When the clock is low, nodes MM and $\overline{MM}$ become virtual grounds. Thus, capacitance on these nodes is relatively inconsequential; in fact, adding capacitance to these nodes slightly lowers τ (at a cost of a somewhat larger $T_w$ value). This allows scan-in circuitry to be added to the pseudo-NMOS latch with no noticeable impact on τ. The design style also reflects the fact that deep sub-micron processes exhibit thoroughly velocity-saturated transistor behavior. As a consequence, two transistors in series have an effective resistance that is much less than twice that of a single transistor (note that this is not because the series transistors are better, but because the single transistor has gotten worse). Thus, unlike the jamb latch that favored parallel configurations of transistors over series ones, the velocity-saturated circuit favors series configurations. The bridge transistor between nodes MM and $\overline{MM}$ makes the synchronizer more robust to transistor width variation. With the bridge transistor, the time constant changes less than 3% even when one side of the cross-tied NMOS or the clock-gated NMOS devices are changed to 75% of their original width. Without the bridge transistor, the time constant changes by 10%.

In some embodiments, the gates of the pull-up PMOS transistors are connected to a voltage reference that keeps the PMOS transistors in saturation, with the expectation that this lowers the $g_{ds}$ of these devices. In alternative embodiments, the best performance is always achieved by setting $V_{REF}$ to ground and using narrower pull-ups. There are two reasons for this. First, the narrower pull-ups contribute lower drain capacitances to nodes Q and $\overline{Q}$. Second, for a given drain-to-source current, narrower transistors with a lower gate voltage (i.e., larger $|V_{gs}|$) consistently have lower values of $g_{ds}$ in many deep sub-micron processes than wider transistors with a higher gate voltage (smaller $|V_{gs}|$).

Because the pseudo-NMOS latch uses passive pull-ups, the circuit consumes some static power, and the output swing is not completely rail-to-rail. However, because only a very small fraction of flip-flops on a large chip are used as synchronizers, the power consumption of the synchronizer is not a major concern. For very low-power designs, the synchronizer could be powered down when not in use. As noted previously, the lack of full-swing at the output of the latch can be solved by using a chain of pseudo-NMOS latches to resolve metastability followed by a traditional flip-flop as the final stage to provide full-swing outputs and satisfy clock-to-Q requirements.

Figure 7C:
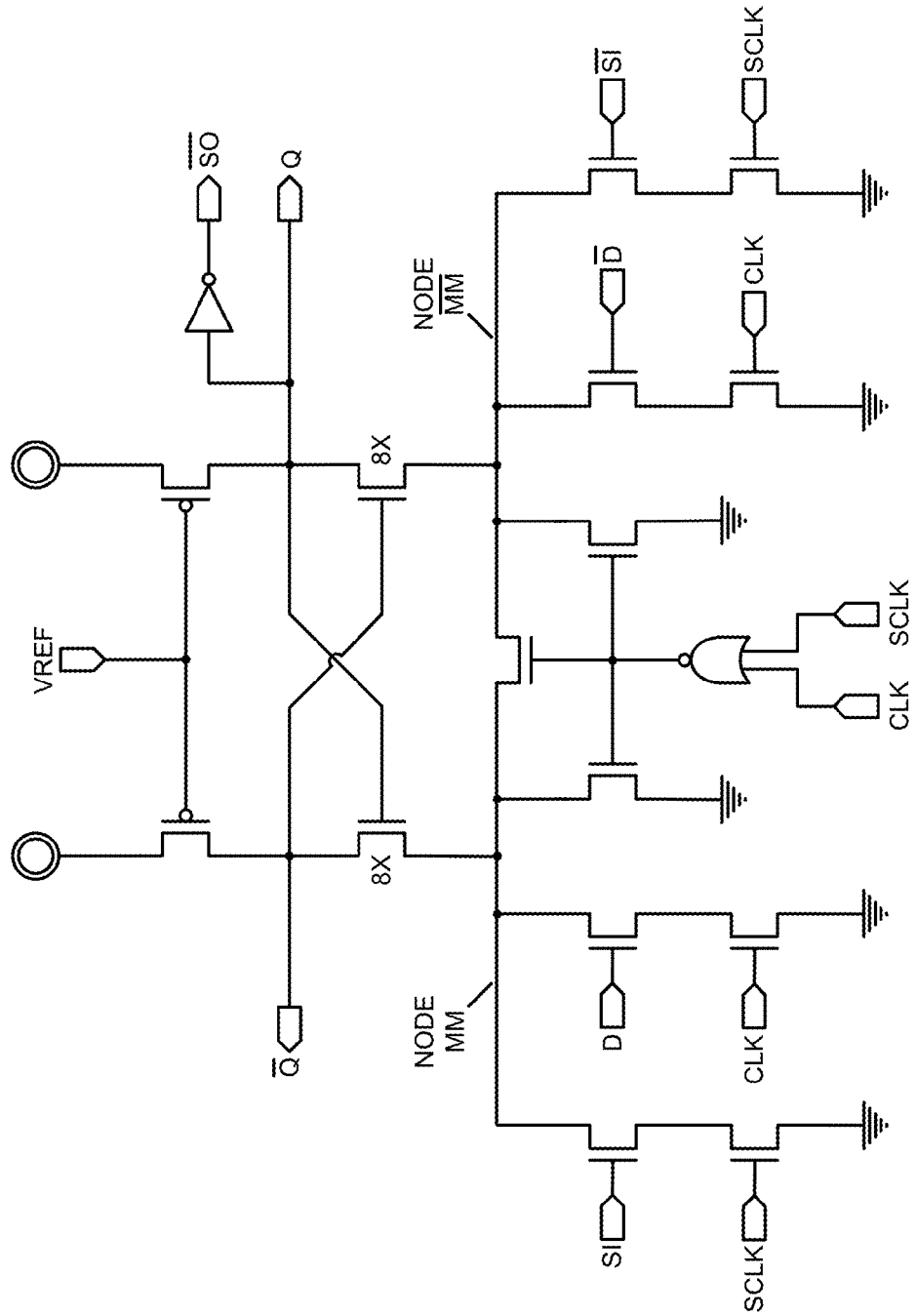
FIG. 7C illustrates a pseudo-NMOS latch with scan capabilities in accordance with an embodiment.

FIG. 7C illustrates how scan circuitry can be added to the pseudo-NMOS latch of FIG. 7A. The location of the scan circuitry is based on an observation that nodes MM and $\overline{MM}$ function as virtual grounds when the latch is opaque. Thus, adding the capacitance of SI and $\overline{SI}$ inputs to these nodes has little impact on the τ value of the synchronizer, and the impact on $T_w$ is also quite minimal. The $\overline{CLK}$ signal that gates the large pull-downs is replaced with a NOR of the main clock (CLK) and the scan clock (SCLK), which slightly delays the time at which the latch goes opaque.

Adding scan to the pseudo-NMOS synchronizer increases its τ value by roughly 15%. Nearly all of this increase is due to the extra inverter loading on the Q output to produce $\overline{SO}$. If scan-out is not required, then this inverter can be omitted, and the performance of the synchronizer with scan-in is indistinguishable from that of the pseudo-NMOS latch of FIG. 7A.

Performance of the Pseudo-NMOS Synchronizer

Figure 8A:
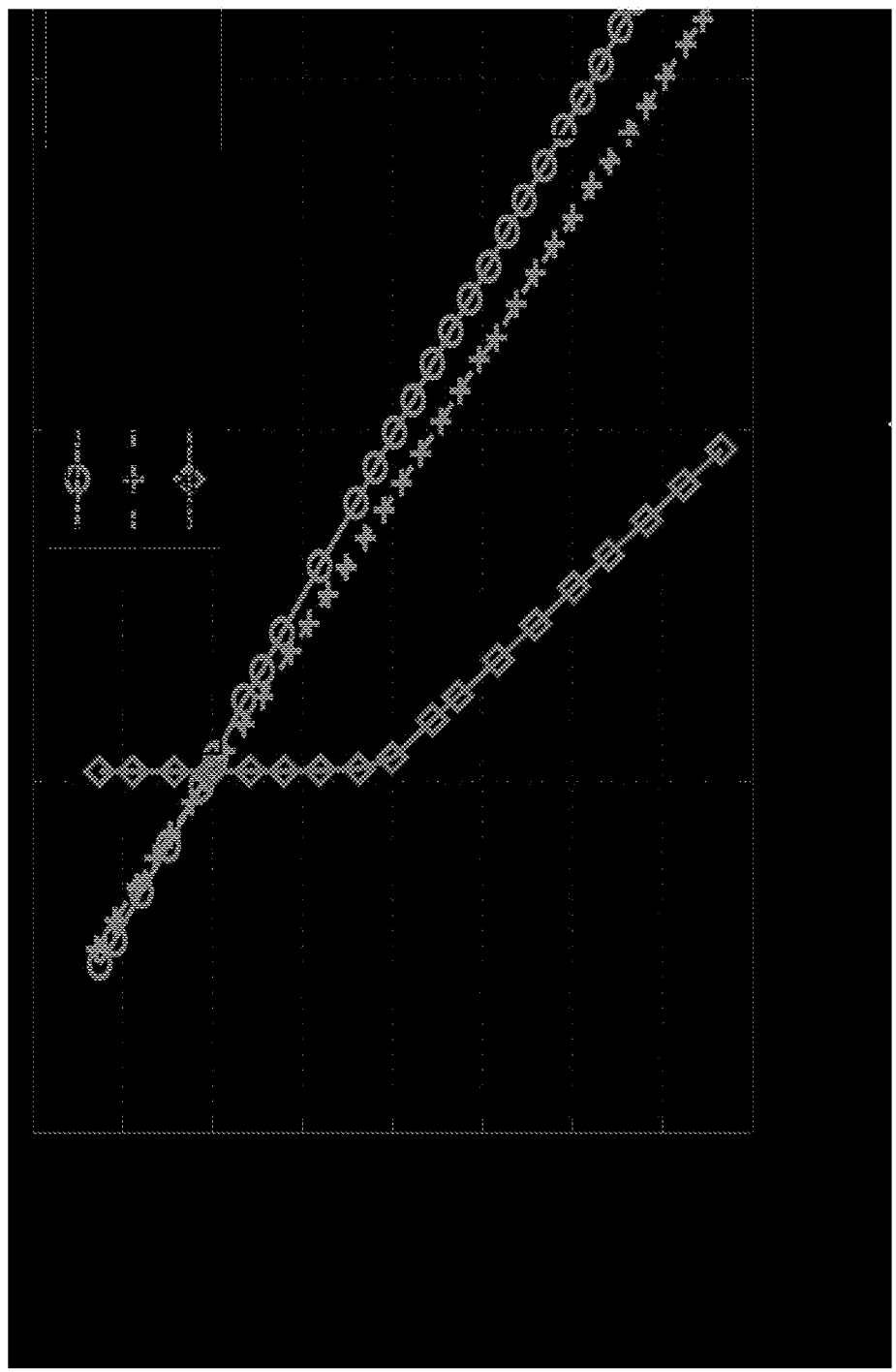
FIG. 8A illustrates the metastability characteristic curves for three synchronizers in accordance with an embodiment.
Figure 8B:
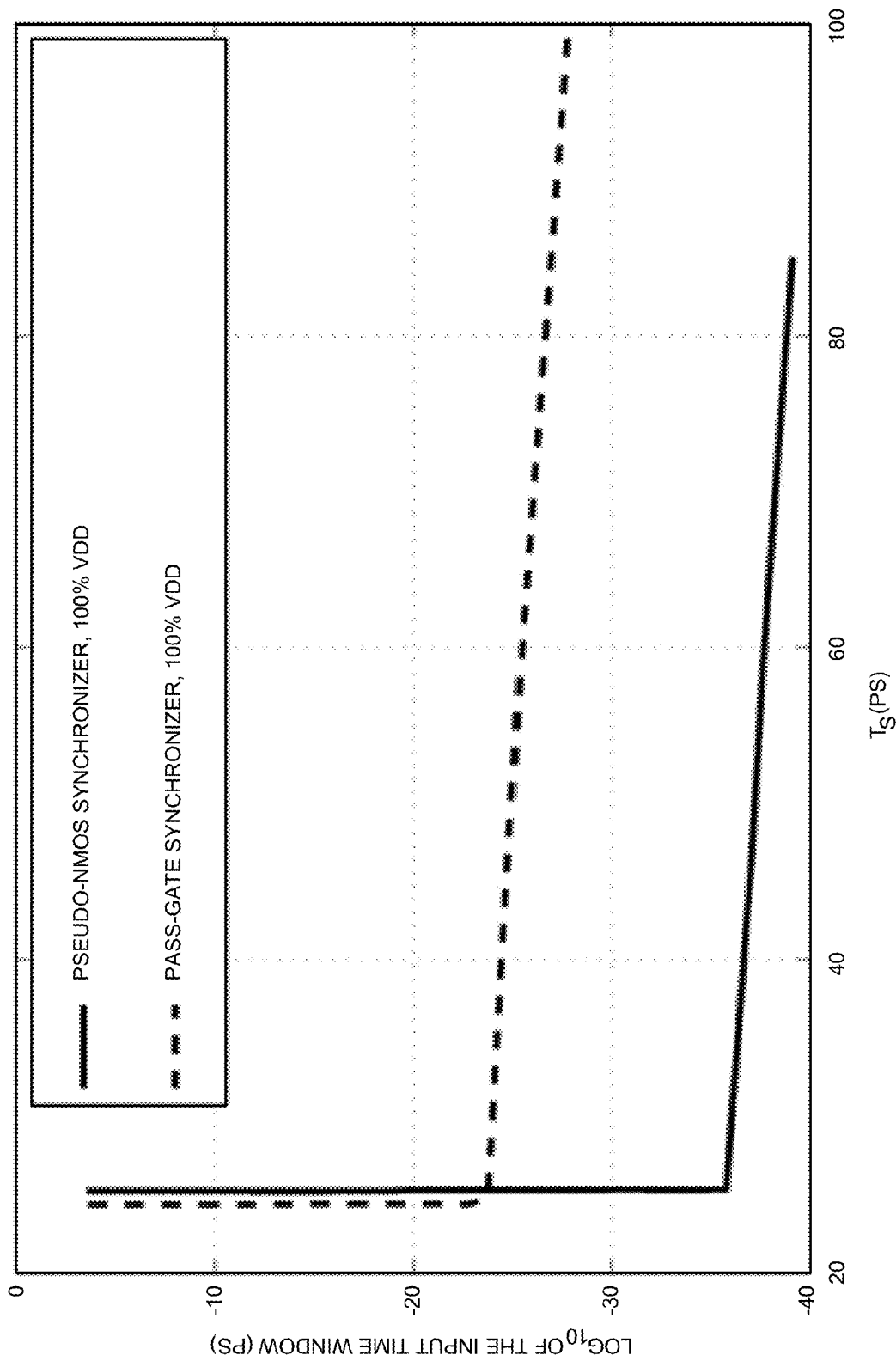
FIG. 8B illustrates a performance comparison between a pass-gate synchronizer and a two-stage synchronizer that includes a pseudo-NMOS master-slave flip-flop in accordance with an embodiment.

FIG. 8A compares the metastability characteristic curves for a pass-gate flip-flop, a jamb-latch flip-flop, and a pseudo-NMOS flip-flop. More specifically, FIG. 8A plots the $T_w$ (e.g., the critical input time window) curves for three single-flip-flop synchronizer designs implemented in a 40 nm process with a 2.5 GHz clock frequency; a steeper curve indicates a synchronizer that resolves more quickly under adverse conditions. Note that the output of the pseudo-NMOS synchronizer first becomes available a half-clock period later than that of the other designs because its latches only produce full-swing logic values when opaque. In the plots of FIGS. 8A-8B, the synchronizer's τ values are proportional to the inverse of the negative slope of the curve. For example, the pseudo-NMOS synchronizer has a τ value that is about half that of the pass-gate synchronizer. The time window values of $T_w$ are given by the value of an extrapolated line for the synchronizer to where it intersects with the y-axis, when $T_s=0$; based on these extrapolations, all three designs have similar values for $T_w$. Hence, for these synchronizers, the lower $\tau$ value for the pseudo-NMOS flip-flop directly indicates improved performance.

FIG. 8B illustrates a performance comparison between a two-stage pass-gate synchronizer and a synchronizer composed of a pseudo-NMOS flip-flop followed by a second stage of a data-flip-flop-based synchronizer. Because the voltage swing of the pseudo-NMOS synchronizer is not fully rail-to-rail, the clock-to-output delay of the flip-flop is slightly longer than that of the pass-gate synchronizer; however, as seen in FIG. 8B, the difference is less than 1 ps, and therefore negligible. The output of the final flip-flop needs to settle within the standard clock-to-Q delay to maximize the amount of logic that can be placed between the synchronizer and the next rank of flip-flops. This corresponds roughly to the "knee" in each curve; in practice, a somewhat longer clock-to-Q delay would be used to provide some timing margin for the design. The width of the input time window at this knee determines the MTBF of the synchronizer. From FIG. 8B, one can see that with nominal $V_{dd}$, a synchronizer with two pseudo-NMOS latches has a MTBF roughly 13 orders of magnitude greater than a synchronizer constructed entirely from pass-gate flip-flops. For many applications, these characteristics allow a pseudo-NMOS synchronizer to achieve an acceptable MTBF with fewer stages and, thus, a lower latency than a synchronizer constructed from traditional flip-flops.

Figure 8C:
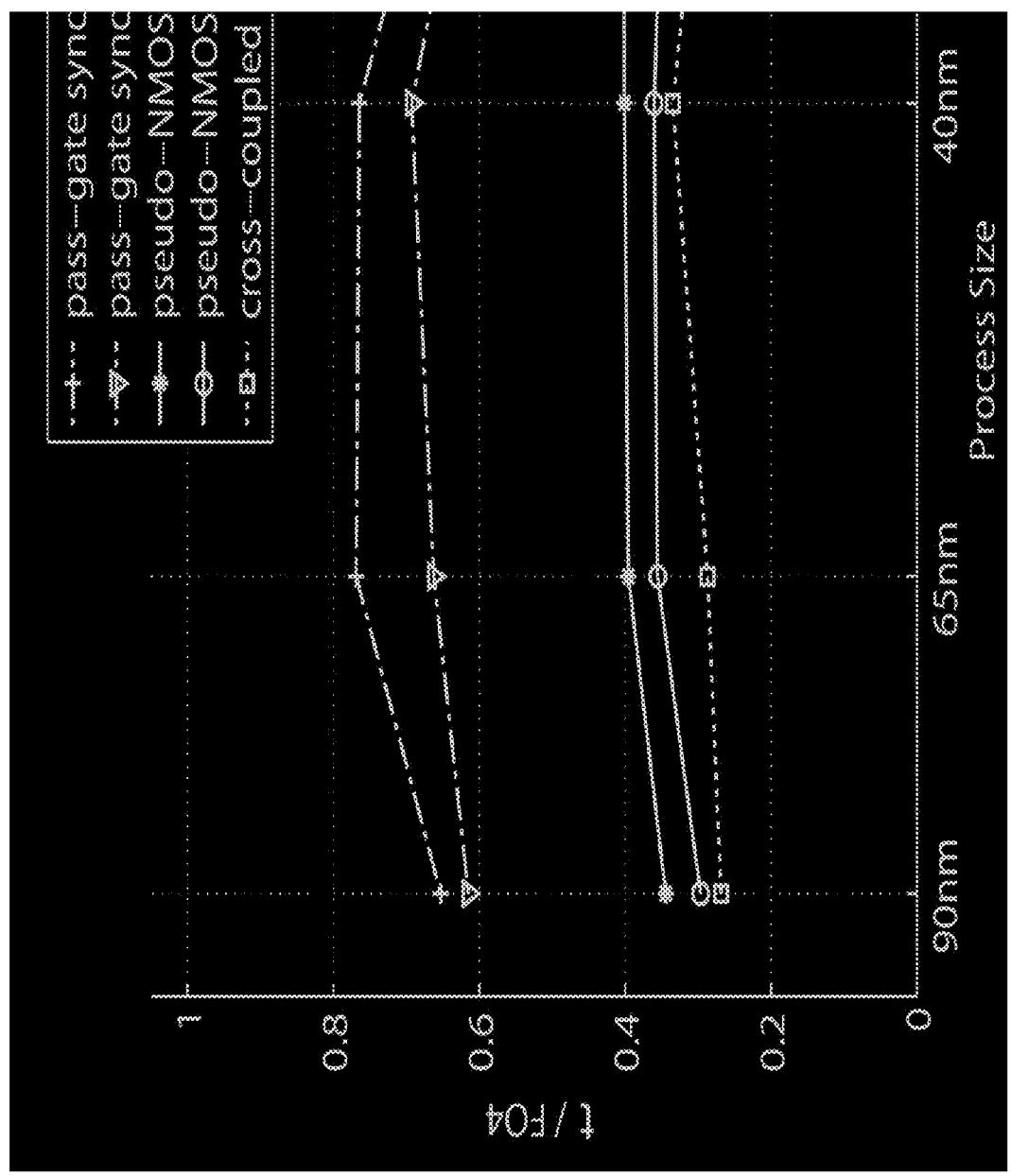
FIG. 8C illustrates the effect of adding scan chains to synchronizers in accordance with an embodiment.

FIG. 8C illustrates the effect of adding scan chains to synchronizers. More specifically, FIG. 8C illustrates how $\tau$/FO4 values (e.g., $\tau$ in comparison with a fan-out-of-four inverter delay) increase when scan is added to synchronizer circuits. Lower $\tau$/FO4 values are better; for comparison purposes, the unloaded cross-coupled inverter $\tau$/FO4 values plotted in FIG. 8C provide a reference for the best performance a circuit might achieve. The pass-gate curves in FIG. 8C illustrate that when scan is added to a flip-flop in such a way as to optimize its performance as a data flip-flop, the resulting performance degradation when the circuit is used as a synchronizer can be severe. For the pass-gate designs, $\tau$/FO4 increases about 8%. In contrast, the pseudo-NMOS curves illustrate that by choosing an appropriate circuit topology, scan can be added to a flip-flop with minimal impact on synchronization performance. These observations hold across the four process technology sizes that were considered. Thus, while scan can severely impact synchronizer performance, it does not prevent synchronizers from scaling in deep sub-micron processes.

Decreasing the operating voltage of a synchronizer circuit can have a negative impact on synchronizer performance. The $\tau$ values of pass-gate and jamb-latch-based synchronizers can be significantly affected by changes to $V_{dd}$, especially as the technology process size becomes smaller. In contrast, the $\tau$ values of the pseudo-NMOS circuit are more robust against changes to $V_{dd}$. Because the PMOS pull-up in the pseudo-NMOS latch is passive, its $V_{gs}$ is not affected by the metastable voltage. This keeps the metastable voltage from dropping as quickly when $V_{dd}$ is lowered. The metastable voltage for the pseudo-NMOS design drops about 0.35 $\Delta V$ for a drop of $V_{dd}$ by $\Delta V$. Because the higher metastable voltage for the pseudo-NMOS circuit keeps its cross-coupled NMOS transistors in a higher $g_m$ (transistor transconductance) region, $\tau$ does not increase as quickly for the pseudo-NMOS circuit as it does for other synchronizer designs. With power consumption being a dominant concern for many designs, the robustness of the pseudo-NMOS design to $V_{dd}$ variations makes it an attractive synchronization option for deep sub-micron processes.

Synchronizer Selection

As described previously, some system designs may employ large numbers of synchronizers to achieve reliable communication between multiple timing domains. Note, however, that depending on the specific timing domains involved, a design may use a wide range of synchronizer circuits. For instance, a very low-frequency signal (e.g., a signal from a keyboard input device) may need only a simple, single-stage standard-cell synchronizer. A higher-frequency timing domain interface might need a larger synchronizer two-stage cell with some additional constraints. Typically, higher frequencies mean that there is less time to resolve metastability; such high frequencies benefit from additional stages (e.g., more time for resolution) and improved synchronization circuits (e.g., circuits with a lower $\tau$ value). The interface to the highest-frequency timing domain in a high-performance design might use some of the disclosed higher-performance synchronizer circuits in synchronizers with two, three, or even more stages.

Note that synchronization design decisions may involve some complexity. For instance, designers may need to consider the potential evolution of a design (e.g., anticipated changes in process technology for later iterations of the design), and hence may need to over-budget synchronization capabilities to account for migration plans. Also, as previously mentioned, data is typically transferred in both directions (e.g., cross-domain interactions typically involve a round trip, as with a processor sending a request to a memory, and then receiving a response), and hence will need to be synchronized to each respective destination clock domain. Design challenges may lead to different synchronization circuitry being used for each respective direction. For example, an additional stage in a receiving synchronizer circuit in a slower time domain (e.g., a memory which a longer clock cycle receiving a request from a high-frequency processor) can result in a much larger time delay than an additional stage in the high-frequency time domain. Hence, a designer noticing that the receiving synchronizer circuit is just on the border of requiring three stages may choose to substitute larger, higher-performance synchronization circuitry that only requires two stages (and hence saves a clock cycle in synchronization delay).

In summary, embodiments of the present invention facilitate resolving metastability issues for synchronization signals between different clock domains. Improved synchronizer latch circuits include lightly loaded, cross-coupled transistors that form a metastable resolving and state-holding element that is coupled to two outputs. Incoming synchronization signals create a voltage difference between the two outputs, but do not directly force a state change for the outputs. Instead, the data and clock inputs control transistors that allow neighboring power sources and/or ground network connections to weakly influence the outputs. The cross-coupled transistors then amplify the resulting voltage difference to generate valid output voltages, even when the data input and clock signal are received at roughly the same time. Thus, the synchronizer latch circuit facilitates rapidly resolving metastability and improving synchronizer performance.

Computing Environment

Figure 9:
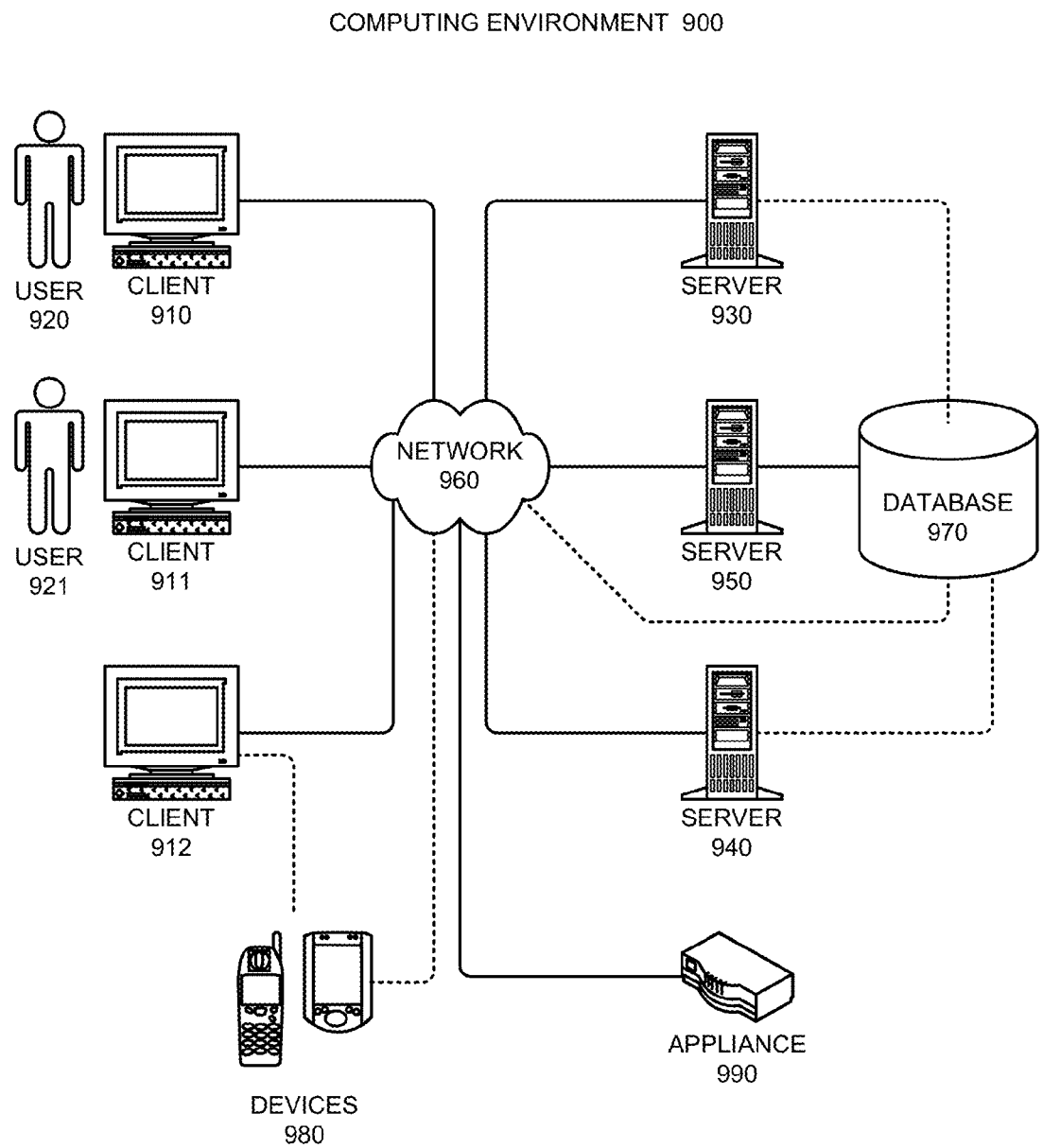
FIG. 9 illustrates a computing environment in accordance with an embodiment.

In some embodiments of the present invention, synchronization circuits and techniques can be incorporated into a wide range of computing devices in a computing environment. For example, FIG. 9 illustrates a computing environment 900 in accordance with an embodiment of the present invention.

Computing environment 900 includes a number of computer systems, which can generally include any type of computer system based on a microprocessor, a mainframe computer, a digital signal processor, a portable computing device, a personal organizer, a device controller, or a computational engine within an appliance. More specifically, referring to FIG. 9, computing environment 900 includes clients 910-912, users 920 and 921, servers 930-950, network 960, database 970, devices 980, and appliance 990.

Clients 910-912 can include any node on a network that includes computational capability and includes a mechanism for communicating across the network. Additionally, clients 910-912 may comprise a tier in an n-tier application architecture, wherein clients 910-912 perform as servers (servicing requests from lower tiers or users), and wherein clients 910-912 perform as clients (forwarding the requests to a higher tier).

Similarly, servers 930-950 can generally include any node on a network including a mechanism for servicing requests from a client for computational and/or data storage resources. Servers 930-950 can participate in an advanced computing cluster, or can act as stand-alone servers. For instance, computing environment 900 can include a large number of compute nodes that are organized into a computing cluster and/or server farm. In one embodiment of the present invention, server 940 is an online "hot spare" of server 950.

Users 920 and 921 can include: an individual; a group of individuals; an organization; a group of organizations; a computing system; a group of computing systems; or any other entity that can interact with computing environment 900.

Network 960 can include any type of wired or wireless communication channel capable of coupling together computing nodes. This includes, but is not limited to, a local area network, a wide area network, or a combination of networks. In one embodiment of the present invention, network 960 includes the Internet. In some embodiments of the present invention, network 960 includes phone and cellular phone networks.

Database 970 can include any type of system for storing data in non-volatile storage. This includes, but is not limited to, systems based upon magnetic, optical, or magneto-optical storage devices, as well as storage devices based on flash memory and/or battery-backed up memory. Note that database 970 can be coupled: to a server (such as server 950), to a client, or directly to a network. In some embodiments of the present invention, database 970 is used to store information that may later be stored in unused bits of a memory pointer. Alternatively, other entities in computing environment 900 may also store such data (e.g., servers 930-950).

Devices 980 can include any type of electronic device that can be coupled to a client, such as client 912. This includes, but is not limited to, cell phones, personal digital assistants (PDAs), smartphones, personal music players (such as MP3 players), gaming systems, digital cameras, portable storage media, or any other device that can be coupled to the client. Note that, in some embodiments of the present invention, devices 980 can be coupled directly to network 960 and can function in the same manner as clients 910-912.

Appliance 990 can include any type of appliance that can be coupled to network 960. This includes, but is not limited to, routers, switches, load balancers, network accelerators, and specialty processors. Appliance 990 may act as a gateway, a proxy, or a translator between server 940 and network 960.

Note that different embodiments of the present invention may use different system configurations, and are not limited to the system configuration illustrated in computing environment 900. Many different clocks are employed in such computing environments, and synchronizers are typically used to facilitate reliable data transfers across different clock domains. In general, any device that includes communication between circuits and/or different clock domains may incorporate elements of the present invention.

Previously described FIGS. 4A-4F and 7A-7C illustrate structures that facilitate synchronization. In some embodiments of the present invention, such circuits can be implemented as dedicated hardware modules in a computing device. For instance, these mechanisms may be incorporated into hardware modules that can include, but are not limited to, processor chips, application-specific integrated circuit (ASIC) chips, field-programmable gate arrays (FPGAs), memory chips, and other programmable-logic devices now known or later developed. For example, in some embodiments of the present invention, a hardware module may include one or more dedicated circuits for performing synchronization operations. As another example, in some embodiments of the present invention, the hardware module is included in a general-purpose computational circuit (e.g., a microprocessor or an ASIC), and is activated in association with executed program code (e.g., BIOS, firmware, etc.) that configures synchronization operations.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A synchronizer latch circuit that facilitates resolving metastability, comprising:
    a data input;
    a clock input;
    a first output;
    a second output;
    a set of two or more cross-coupled transistors, wherein the gate of a first cross-coupled transistor is coupled to the second output, the gate of a second cross-coupled transistor is coupled to the first output, the drain of the first cross-coupled transistor is coupled to the first output, and the drain of the second cross-coupled transistor is coupled to the second output; and
    a third transistor, wherein the data input is coupled to the gate of the third transistor;
    wherein, upon receiving a synchronization signal, the data input activates the third transistor to change a voltage of the first output and create a voltage difference between the first output and the second output, and wherein the cross-coupled transistors amplify the voltage difference to generate valid logic output voltages even when the data input arrives within a setup-and-hold time window of the synchronizer latch circuit.

2. The synchronizer latch circuit of claim 1,
    wherein the data input drives transistors that enable at least one of a power source and a virtual ground to weakly influence one of the first output and the second output; and
    wherein using at least one of the power source and the virtual ground to weakly influence one of the first output and the second output facilitates resolving an output voltage for the first output and the second output.

3. The synchronizer latch circuit of claim 2,
wherein the drain of the third transistor is coupled to the drain of the first transistor and the source of the third transistor is coupled to the drain of a fourth transistor;
wherein the source of the fourth transistor is coupled to a power source;
wherein the gate of the fourth transistor is controlled by a clock signal from the clock input; and
wherein when the clock signal sets the synchronizer latch circuit into a transparent state and the data input activates the third transistor, the power source weakly drives the first output to a high voltage via the fourth transistor and the third transistor.

4. The synchronizer latch circuit of claim 3,
wherein a second data input receives a complement of the data input;
wherein the second data signal is coupled to the gate of a fifth transistor;
wherein the source of the fifth transistor is coupled to ground and the drain of the fifth transistor is coupled to the source of the second transistor; and
wherein, when the data input enables the first output to be driven by the power source, the second data input enables the second output to be pulled down to a low voltage via the fifth transistor and the second transistor.

5. The synchronizer latch circuit of claim 4,
wherein the synchronization latch circuit further comprises a sixth transistor;
wherein the gate of the sixth transistor is coupled to the second output;
wherein the drain of the sixth transistor is coupled to the first output;
wherein the source of the sixth transistor is coupled to the power source;
wherein the gate of the sixth transistor is enabled when the second output is driven low, thereby enabling the power source to strongly drive the first output to the high voltage; and
wherein feedback via the cross-coupled transistors amplifies the voltages of the first output and second output, thereby resolving them to valid logic high and low voltages.

6. The synchronizer latch circuit of claim 5,
wherein when the clock signal sets the synchronizer latch circuit into an opaque state, the clock signal disables current flow through the fourth transistor and enables a set of transistors that connect the sources of the first and second transistors to ground-forming virtual-ground nodes at the sources of the first and second transistors; and
wherein the virtual-ground nodes and the signals held by the cross-coupled transistors hold the values of the first output and the second output at stable logic levels when the synchronizer latch circuit is in the state-holding opaque state.

7. The synchronizer latch circuit of claim 6, wherein two or more synchronizer latch circuits are combined in series to improve the mean time between failures for the synchronization signal.

8. The synchronization latch circuit of claim 7,
wherein a data-path flip-flop serves as a final synchronization stage for a chain of two or more synchronizer stages; and
wherein the clock-to-Q delay of the data-path flip-flop facilitates adding more combinational logic after the final synchronization stage.

9. The synchronization latch circuit of claim 7, wherein the synchronization latch circuit further comprises:
a multiplexer that selects between the data input and a scan-in signal; and
a scan-out latch coupled to at least one of the first output and the second output;
wherein the multiplexer and scan-out latch facilitate circuit reset, circuit initialization, and chip testing.

10. The synchronizer latch circuit of claim 2,
wherein the synchronizer latch circuit further comprises a seventh transistor and an eighth transistor;
wherein the gate of the seventh transistor and the gate of the eighth transistor are coupled to a reference voltage;
wherein the source of the seventh transistor and the source of the eighth transistor are coupled to a power source;
wherein the drain of the first transistor is coupled to the drain of the seventh transistor;
wherein the drain of the second transistor is coupled to the drain of the eighth transistor;
wherein the source of the third transistor is coupled to ground; and
wherein the drain of the third transistor is coupled to the source of the first transistor.

11. The synchronizer latch circuit of claim 10,
wherein the seventh and eighth transistors passively pull up the voltage levels for the first output and the second output, thereby activating the first transistor and the second transistor;
wherein when the data input enables the third transistor, the voltage at the first output is pulled lower than the voltage at the second output; and
wherein feedback between the cross-coupled transistors drives the second output to a high voltage and drives the first output to a low voltage.

12. The synchronizer latch circuit of claim 11, wherein the reference voltage is a ground voltage.

13. The synchronizer latch circuit of claim 12,
wherein when a clock signal from the clock input sets the synchronizer latch circuit into an opaque state, the clock signal enables a set of transistors that turn a set of nets that the sources of the first and second transistors are connected to into virtual ground nets; and
wherein the cross-coupled transistors amplify the difference in voltage between their drains such that they drive and then hold the first output and the second output to opposite logic high and low voltages when the synchronizer latch circuit is in the opaque state.

14. A computing device, comprising:
a transmitting component that operates in a first clock domain; and
a receiving component that operates in a second clock domain;
wherein the receiving component includes a synchronizer latch circuit that facilitates resolving metastability, wherein the synchronizer latch circuit comprises:
a data input that receives a synchronization signal from the transmitting component;
a clock input;
a first output;
a second output;
a set of two or more cross-coupled transistors, wherein the gate of a first cross-coupled transistor is coupled to the second output, the gate of a second cross-coupled transistor is coupled to the first output, the drain of the first cross-coupled transistor is coupled to the first output, and the drain of the second cross-coupled transistor is coupled to the second output; and a third transistor, wherein the data input is coupled to the gate of the third transistor;

wherein, upon receiving the synchronization signal, the data input activates the third transistor to change a voltage of the first output and create a voltage difference between the first output and the second output, and wherein the cross-coupled transistors amplify the voltage difference to generate valid logic output voltages even when the data input arrives within a setup-and-hold time window of the synchronizer latch circuit.

15. The computing device of claim 14, wherein the data input drives transistors that enable at least one of a power source and virtual-ground nodes to weakly influence one of the first output and the second output; and wherein using at least one of the power source and the virtual-ground nodes to weakly influence one of the first output and the second output facilitates resolving an output voltage for the first output and the second output.

16. The computing device of claim 15, wherein the drain of the third transistor is coupled to the drain of the first transistor and the source of the third transistor is coupled to the drain of a fourth transistor;

wherein the source of the fourth transistor is coupled to a power source;

wherein the gate of the fourth transistor is controlled by a clock signal from the clock input; and wherein when the clock signal sets the synchronizer latch circuit into a transparent state and the data input activates the third transistor, the power source weakly drives the first output to a high voltage via the fourth transistor and the third transistor.

17. The computing device of claim 16, wherein a second data input receives a complement of the data input;

wherein the second data signal is coupled to the gate of a fifth transistor;

wherein the source of the fifth transistor is coupled to ground and the drain of the fifth transistor is coupled to the source of the second transistor; and wherein, when the data input enables the first output to be driven by the power source, the second data input enables the second output to be pulled down to a low voltage via the fifth transistor and the second transistor.

18. The computing device of claim 17, wherein the synchronization latch circuit further comprises a sixth transistor;

wherein the gate of the sixth transistor is coupled to the second output;

wherein the drain of the sixth transistor is coupled to the first output;

wherein the source of the sixth transistor is coupled to the power source;

wherein the gate of the sixth transistor is enabled when the second output is driven low, thereby enabling the power source to strongly drive the first output to the high voltage; and wherein feedback via the cross-coupled transistors amplifies the voltages of the first output and second output, thereby resolving them to valid logic high and low voltages.

19. The computing device of claim 18, wherein when the clock signal sets the synchronizer latch circuit into an opaque state, the clock signal disables current flow through the fourth transistor and enables a set of transistors that connect the sources of the first and second transistors to a ground-forming virtual-ground nodes at the sources of the first and second transistors; and wherein the virtual-ground nodes and the signals held by the cross-coupled transistors hold the values of the first output and the second output at stable logic levels when the synchronizer latch circuit is in the state-holding opaque state.

20. A method for using a synchronizer latch circuit to resolve metastability, comprising:

receiving a synchronization signal, wherein the synchronization signal is received by a data input in a synchronizer latch circuit, wherein the synchronizer latch circuit comprises:

a clock input;

a first output;

a second output;

a set of two or more cross-coupled transistors, wherein the gate of a first cross-coupled transistor is coupled to the second output, the gate of a second cross-coupled transistor is coupled to the first output, the drain of the first cross-coupled transistor is coupled to the first output, and the drain of the second cross-coupled transistor is coupled to the second output; and a third transistor, wherein the data input is coupled to the gate of the third transistor; and upon receiving the synchronization signal, activating the third transistor to change a voltage of the first output and create a voltage difference between the first output and the second output, and wherein the cross-coupled transistors amplify the voltage difference to generate valid logic output voltages even when the data input arrives within a setup-and-hold time window of the synchronizer latch circuit.

* * * * *

UNITED STATES PATENT AND TRADEMARK OFFICE
CERTIFICATE OF CORRECTION

| | | |
|---|---|---|
| PATENT NO. | : 8,552,779 B2 | Page 1 of 1 |
| APPLICATION NO. | : 13/306828 | |
| DATED | : October 8, 2013 | |
| INVENTOR(S) | : Jones et al. | |

It is certified that error appears in the above-identified patent and that said Letters Patent is hereby corrected as shown below:

In the Specification

In column 13, line 65, delete "$\Delta T_{IN}$," and insert -- $\Delta TIN$ --, therefor.

In the Claims

In column 21, line 61, in Claim 8, delete "synchronization" and insert -- synchronizer --, therefor.

In column 22, line 1, in Claim 9, delete "synchronization" and insert -- synchronizer --, therefor.

Signed and Sealed this
Twenty-fifth Day of February, 2014

Michelle K. Lee
*Deputy Director of the United States Patent and Trademark Office*